(12) United States Patent
Nojima

(10) Patent No.: US 10,199,375 B2
(45) Date of Patent: Feb. 5, 2019

(54) STORAGE DEVICE AND CAPACITOR

(71) Applicant: TOSHIBA MEMORY CORPORATION, Minato-ku, Tokyo (JP)

(72) Inventor: Kazuhiro Nojima, Yokkaichi Mie (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 15/694,740

(22) Filed: Sep. 1, 2017

(65) Prior Publication Data
US 2018/0269203 A1    Sep. 20, 2018

(30) Foreign Application Priority Data
Mar. 17, 2017  (JP) .................. 2017-053512

(51) Int. Cl.
*H01L 27/06* (2006.01)
*H01L 49/02* (2006.01)
*H01L 27/115* (2017.01)

(52) U.S. Cl.
CPC ........ *H01L 27/0688* (2013.01); *H01L 27/115* (2013.01); *H01L 28/60* (2013.01)

(58) Field of Classification Search
CPC . H01L 51/56; H01L 51/5072; H01L 51/5012; H01L 51/5056; H01L 33/62
USPC .......................................... 257/532
See application file for complete search history.

(56) References Cited

U.S. PATENT DOCUMENTS

| | | | |
|---|---|---|---|
| 6,137,713 A * | 10/2000 | Kuroda | G11C 5/02 257/E21.657 |
| 6,197,633 B1 * | 3/2001 | Schindler | H01L 27/10817 257/E21.648 |
| 7,910,973 B2 | 3/2011 | Sakaguchi et al. | |
| 8,643,142 B2 | 2/2014 | Higashitani et al. | |
| 9,190,490 B2 | 11/2015 | Koval et al. | |
| 9,490,499 B2 | 11/2016 | Kawai et al. | |
| 9,548,085 B2 | 1/2017 | Saitoh | |
| 2013/0051126 A1 | 2/2013 | Kwong | |
| 2015/0076578 A1 | 3/2015 | Sakamoto et al. | |
| 2016/0079069 A1 | 3/2016 | Uenaka et al. | |

* cited by examiner

*Primary Examiner* — Andy Huynh
(74) *Attorney, Agent, or Firm* — Foley & Lardner LLP

(57) ABSTRACT

A capacitor includes a plurality of first electrode layers stacked in a first direction, a first conductor extending in the first direction through the plurality of first electrode layers, and a first insulating layer extending in the first direction along the first conductor and located between the first conductor and the plurality of first electrode layers. The capacitor includes a first capacitance provided between the first conductor and the plurality of first electrode layers.

11 Claims, 20 Drawing Sheets

STORAGE DEVICE AND CAPACITOR

CROSS-REFERENCE TO RELATED APPLICATION

This application is based upon and claims the benefit of and priority to Japanese Patent Application No. 2017-053512, filed Mar. 17, 2017, the entire contents of which are incorporated herein by reference.

FIELD

Embodiments described herein relate generally to a storage device and a capacitor.

BACKGROUND

A storage device includes a memory region in which a plurality of memory cells are disposed, and a circuit region, which includes a capacitor so as to drive the memory cells.

DETAILED DESCRIPTION

Figure 1A:
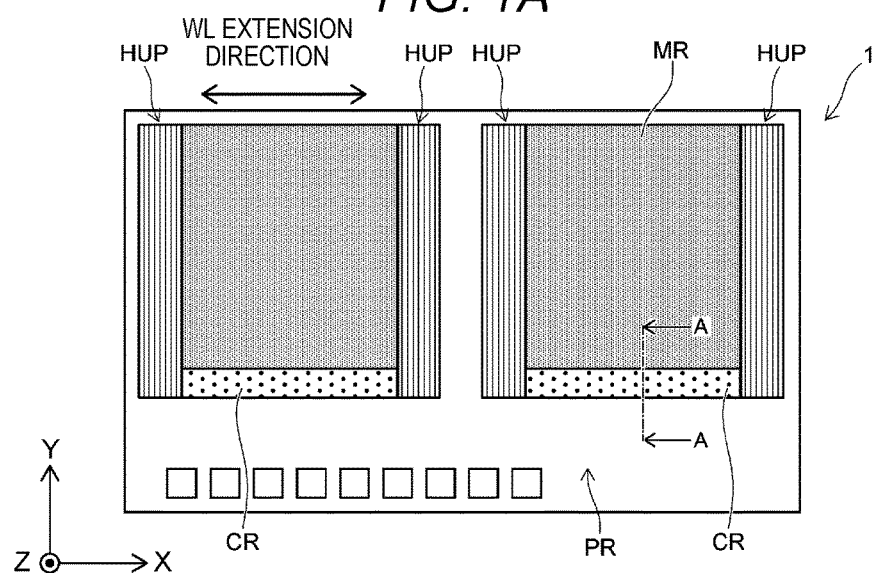
FIG. 1A and FIG. 1B are schematic views illustrating a storage device according to some embodiments.

An example embodiment provides a storage device and a capacitor, which may reduce the occupation rate of a circuit region.

In general, according to some embodiments, a capacitor may include a plurality of first electrode layers that are stacked in a first direction, a first conductor that extends in the first direction through the plurality of first electrode layers, and a first insulating layer that extends in the first direction along the first conductor and is located between the first conductor and the plurality of first electrode layers, and the capacitor may include first capacitances respectively provided between the first conductor and the plurality of first electrode layers.

Hereinafter, example embodiments will be described with reference to the drawings. In the drawings, the similar parts will be denoted by the same reference numerals and the detailed descriptions thereof may be appropriately omitted and different parts will be described. In addition, the drawings may be schematic or conceptual, and for example, a relationship between a thickness and a width of each part, or a ratio of the sizes of the respective parts may be different from an actual value. Moreover, even in a case of representing the same parts, the dimensions or ratios of the parts may be illustrated differently by the drawings.

In addition, the arrangement and configuration of each part may be described using an X-axis, a Y-axis, and a Z-axis illustrated in each drawing. The X-axis, the Y-axis, and the Z-axis are orthogonal to each other and represent the X direction, the Y direction, and the Z direction, respectively. In addition, the Z direction may be described as upward and the opposite direction thereof may be described as downward.

Figure 1B:
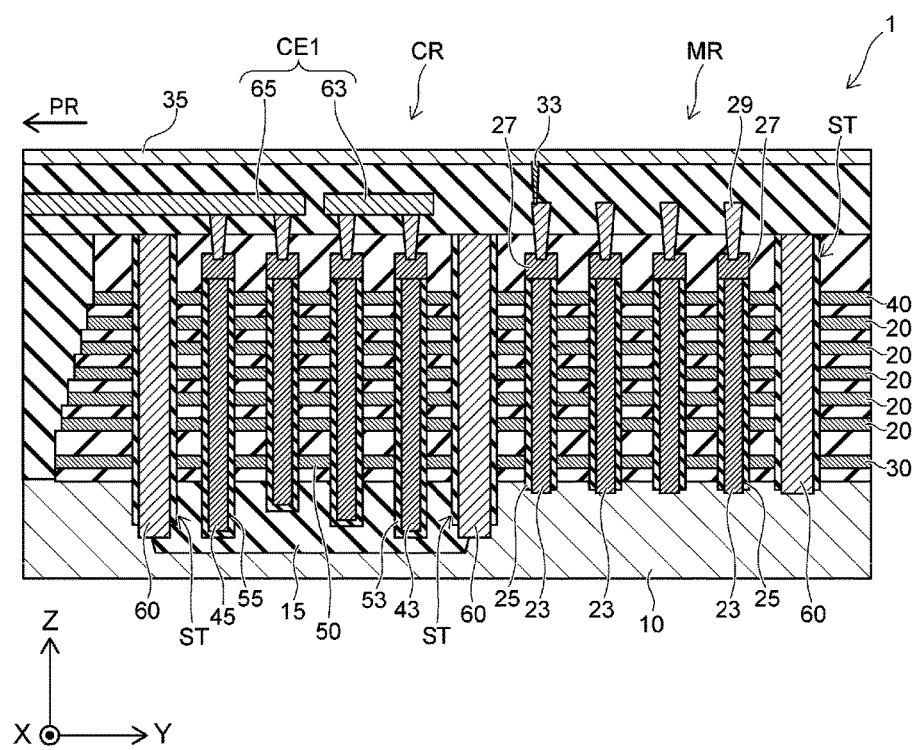

FIG. 1A and FIG. 1B are schematic views illustrating a storage device 1 according to some embodiments. In some embodiments, the storage device 1 is, for example, a flash memory including three-dimensionally arranged memory cells. FIG. 1A is a plan view illustrating an arrangement of a chip surface of the storage device 1. FIG. 1B is a cross-sectional view taken along line A-A illustrated in FIG. 1A.

In some embodiments, as illustrated in FIG. 1A, the storage device 1 includes a plurality of memory regions MR and a peripheral region PR therearound. In some embodiments, in the peripheral region PR, a circuit (not illustrated) may be provided to drive memory cells. In some embodiments, the storage device 1 further includes a passive region CR in which a capacitor is provided. In some embodiments, the passive region CR and the memory region MR are arranged side by side, for example, in the Y direction.

In some embodiments, as illustrated in FIG. 1B, the memory region MR includes a plurality of word lines (WLs) 20, a source side selection gate 30, and a drain side selection gate 40, which are stacked on a source layer 10. In some embodiments, the memory region MR includes channel layers 23 and memory layers 25. In some embodiments, each channel layer 23 extends in the Z direction through the source side selection gate 30, the plurality of word lines 20, and the drain side selection gate 40. In some embodiments, each memory layer 25 is located between the word lines 20 and a channel layer 23 and extends in the Z direction along the channel layer 23.

In some embodiments, the memory cells are provided in respective portions in which the channel layers 23 penetrate the word lines 20. In some embodiments, the memory layers 25 can function as charge retention layers of the memory cells in the portions in which the memory layers 25 are respectively located between the word lines 20 and the channel layers 23. In some embodiments, the channel layers 23 may be electrically connected to the source layer 10 at the lower ends thereof. In some embodiments, each of the channel layers 23 may be electrically connected to a bit line 35 via a cap layer 27 and contact plugs 29 and 33, which are provided at the upper end thereof.

In some embodiments, each word line 20 may be electrically separated from another word line 20, which is adjacent thereto in the Y direction, by a slit ST, and extends in the X direction. In some embodiments, by an interlayer insulating layer, the respective word lines 20 stacked in the Z direction may be electrically insulated from each other, the lowermost layer of the word lines 20 and the source side selection gate 30 may be electrically insulated from each other, and the uppermost layer of the word lines 20 and the drain side selection gate 40 may be electrically insulated from each other. In some embodiments, a conductor 60 is provided inside the slit ST. In some embodiments, the conductor 60 may electrically connect the source layer 10 to a source line 39 via a contact plug 37 (see FIG. 5).

In some embodiments, lead-out portions HUP are provided at the opposite ends of the respective word lines 20 in the X direction (see FIG. 1A). In some embodiments, in the lead-out portions HUP, the ends of the word lines 20 stacked in the Z direction are provided in the form of a step, and contact plugs electrically connected to the respective word lines 20 are arranged (see FIG. 10).

In some embodiments, as illustrated in FIG. 1B, the passive region CR includes an insulating layer 15, a plurality of electrode layers 50, and columnar conductors 43 and 45. In some embodiments, the insulating layer 15 is provided inside the source layer 10, and the upper surface of the insulating layer 15 is positioned at the same level as, for example, the upper surface of the source layer 10. In some embodiments, the electrode layers 50 are stacked on the insulating layer 15 via an interlayer insulating layer. In some embodiments, the columnar conductor 43 extends in the Z direction through the electrode layers 50, and is electrically connected to a wiring 63. In some embodiments, the columnar conductor 45 extends in the Z direction through the electrode layers 50, and is electrically connected to a wiring 65. In some embodiments, an insulating layer 53 is formed between the columnar conductor 43 and the electrode layers 50. In some embodiments, the insulating layer 53 surrounds the side surface of the columnar conductor 43 and extends in the Z direction. In some embodiments, an insulating layer 55 is provided between the columnar conductor 45 and the electrode layers 50. In some embodiments, the insulating layer 55 surrounds the side surface of the columnar conductor 45 and extends in the Z direction. In some embodiments, the columnar conductors 43 and 45 may be electrically insulated from the source layer 10.

In some embodiments, a capacitor CE1 is provided in the passive region CR. In some embodiments, the capacitor CE1 includes the columnar conductors 43 and 45 and the wirings 63 and 65. In some embodiments, the wires 63 and 65 may be, for example, connected to a circuit provided in the peripheral region PR, and the capacitor CE1 functions as a circuit element having a capacitance value therebetween.

Figure 2:
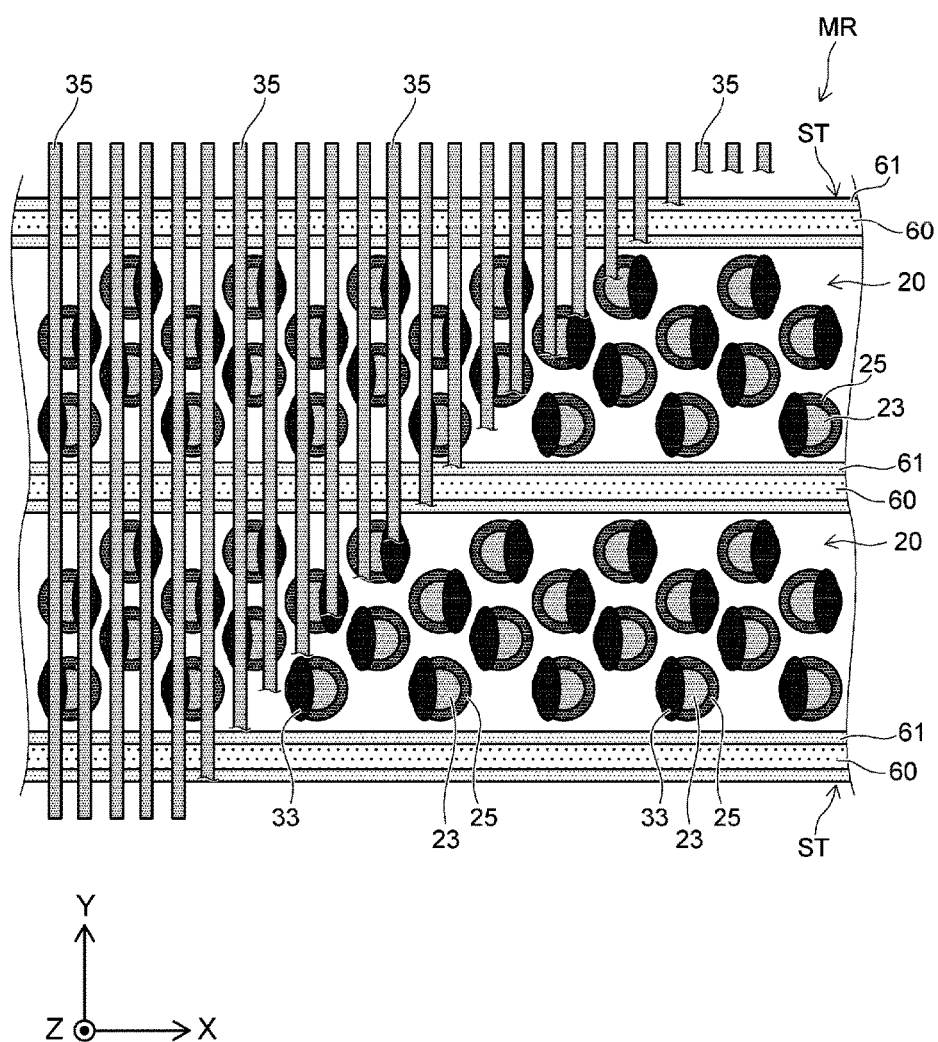
FIG. 2 is a schematic plan view illustrating a memory region of the storage device according to some embodiments.

Next, the configuration of the memory region MR will be described with reference to FIG. 2. FIG. 2 is a schematic plan view illustrating a memory region of the storage device 1.

In some embodiments, as illustrated in FIG. 2, slits ST extend in the X direction, and a conductor 60 is provided inside each slit ST. In some embodiments, the conductor 60 may be electrically insulated from word lines 20 by insulating layers 61. In some embodiments, the conductor 60 may include, for example, tungsten, and the insulating layers 61 may be, for example, silicon oxide layers. In some embodiments, each word line 20 is provided between the adjacent slits ST in the Y direction and extends in the X direction. In some embodiments, the word line 20 includes, for example, a metal such as tungsten, or low resistance polysilicon.

In some embodiments, a plurality of channel layers 23 are provided so as to penetrate the word lines 20 stacked in the Z direction. In some embodiments, each channel layer 23 is provided, for example, in a columnar shape, and a memory layer 25 is provided so as to surround the side surface of each channel layer. In some embodiments, the channel layer 23 may be, for example, a polysilicon layer. In some embodiments, the memory layer 25 has, for example, a structure in which a plurality of insulating films are stacked in the direction from the word lines 20 toward the channel layer 23. In some embodiments, the memory layer 25 may have, for example, a structure in which a first silicon oxide film, a silicon nitride film, and a second silicon oxide film are sequentially.

In some embodiments, in the upper side of the memory region MR, a plurality of bit lines 35 are provided. In some embodiments, the bit lines 35 may be, for example, a metal wiring including tungsten, and each may extend in the Y direction. In some embodiments, each channel layer 23 is electrically connected to one of the bit lines 35 via a contact plug 33. In some embodiments, the contact plug 33 may include, for example, a metal such as tungsten. In some embodiments, as shown in FIG. 2, the cap layer 27 (see FIG. 1B) may be omitted.

Figure 3:
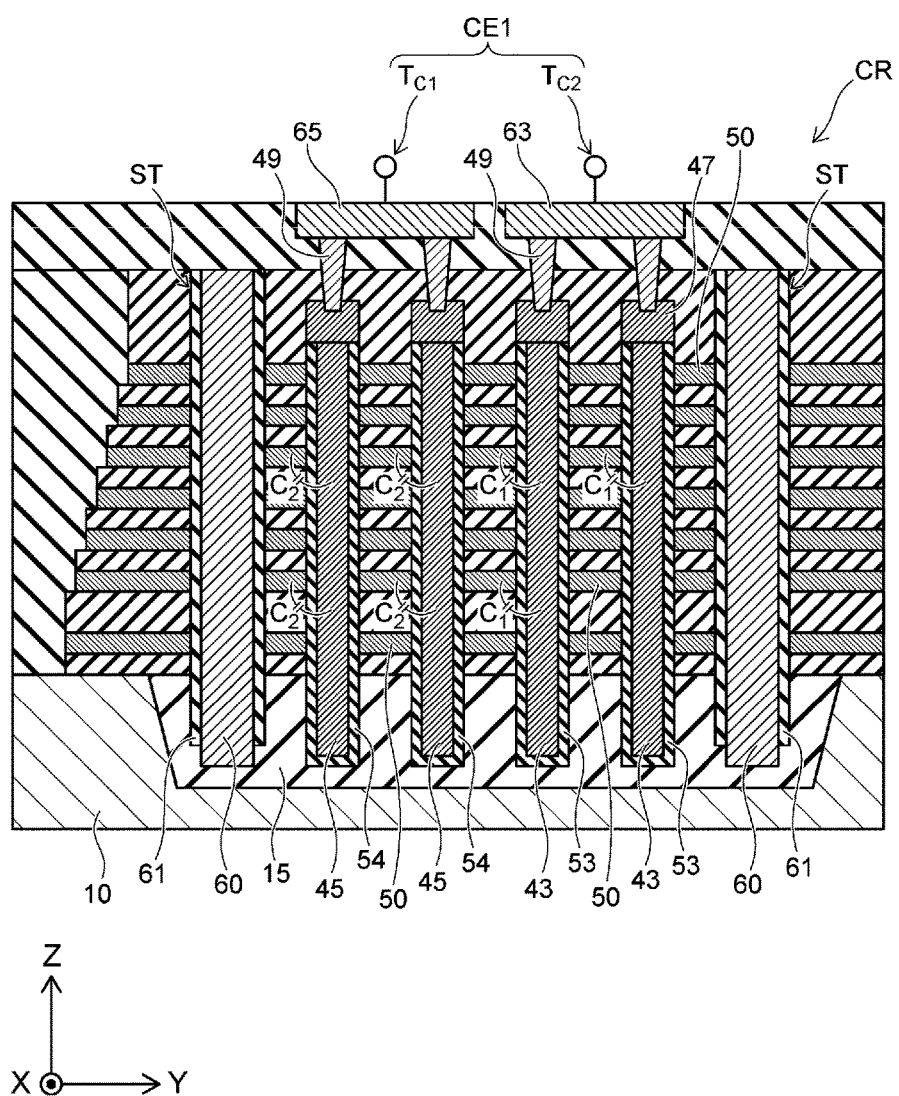
FIG. 3 is a schematic sectional view illustrating a capacitor according to some embodiments.
Figure 4:
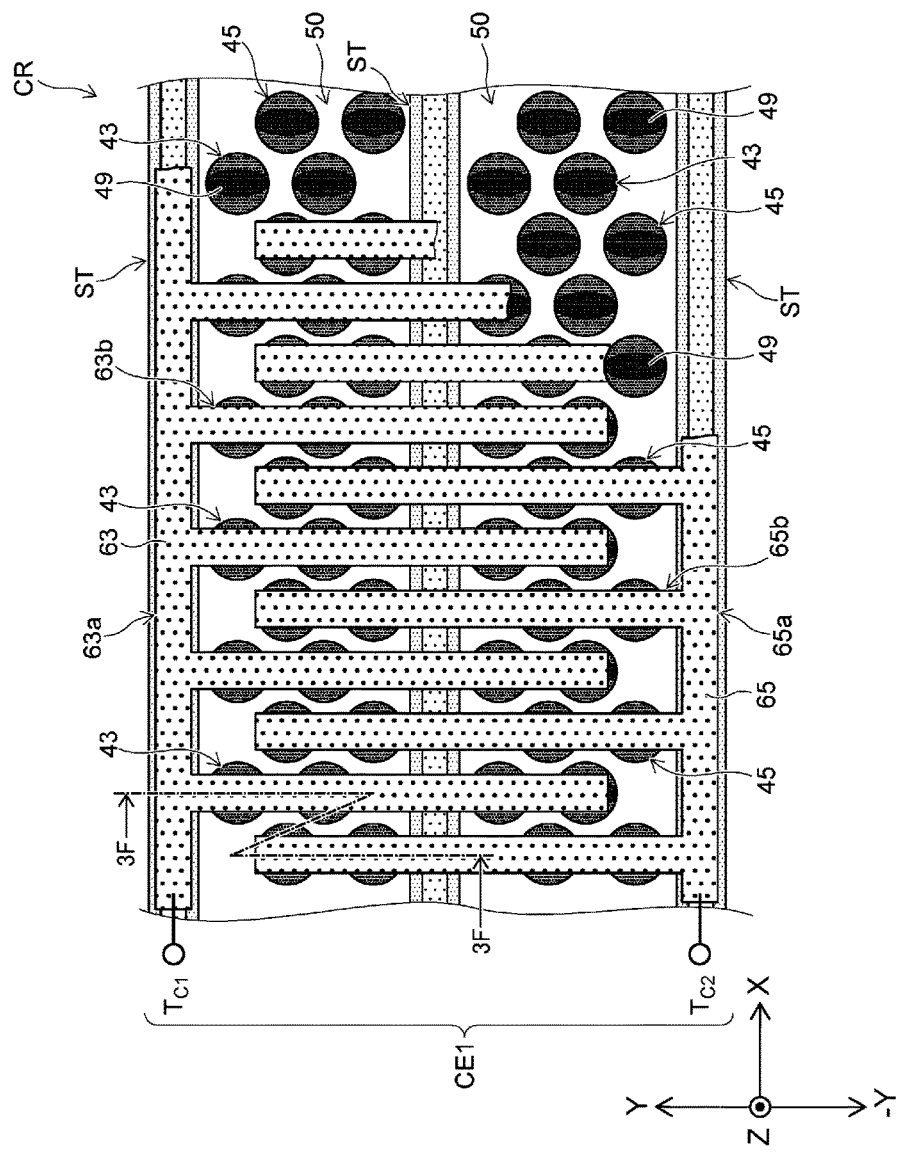
FIG. 4 is a schematic plan view illustrating wirings of the capacitor according to some embodiments.

Next, the capacitor CE1 will be described with reference to FIG. 3 and FIG. 4. FIG. 3 is a schematic sectional view illustrating the capacitor CE1 provided in the passive region CR. FIG. 4 is a schematic plan view illustrating the wirings 63 and 65 of the capacitor CE1. FIG. 3 is a cross-sectional view taken along line 3F-3F illustrated in FIG. 4.

In some embodiments, as illustrated in FIG. 3, the insulating layer 15 may be, for example, a silicon oxide layer, and is provided in the source layer 10. In some embodiments, the source layer 10 may be, for example, a substrate in which a source line (not illustrated) is formed on the surface layer, and the insulating layer 15 may be so-called shallow trench isolation (STI).

In some embodiments, the electrode layers 50 are stacked on the insulating layer 15 between the slits ST. In some embodiments, the adjacent electrode layers 50 in the Z direction are insulated from each other via an interlayer insulating layer such as a silicon oxide layer. In some embodiments, the electrode layers 50 may be, for example, metal layers including tungsten. In some embodiments, the electrode layers 50 may be low resistance polysilicon layers.

In some embodiments, the columnar conductors 43 and 45 respectively extend through the electrode layers 50 in the Z direction. In some embodiments, the lower ends of the columnar conductors 43 and 45 are located, for example, in the insulating layer 15. In some embodiments, the columnar conductors 43 and 45 may be electrically insulated from the source layer 10. In some embodiments, the columnar conductors 43 and 45 are respectively connected to the wirings 63 and 65 via a cap layer 47 and a contact plug 49 provided at the upper ends thereof.

In some embodiments, the columnar conductors 43 and 45 may include, for example, a metal such as tungsten. In some embodiments, the columnar conductors 43 and 45 may include, for example, polysilicon. In some embodiments, the cap layer 47 may be, for example, a low resistance polysilicon layer. In some embodiments, the contact plug 49 may include, for example, a metal such as tungsten. In some embodiments, the wirings 63 and 65 are metal wirings including, for example, tungsten and have terminals $T_{C1}$ and $T_{C2}$.

In some embodiments, the insulating layer 53 is provided between the columnar conductor 43 and the electrode layers 50. In some embodiments, an insulating layer 54 is provided between the columnar conductor 45 and the electrode layers 50. In some embodiments, the insulating layers 53 and may be, for example, silicon oxide layers. In some embodiments, the insulating layers 53 and 54 may have, for example, a structure in which a plurality of insulating films are stacked.

In some embodiments, as illustrated in FIG. 3, capacitances $C_1$ (e.g., via capacitors) are respectively interposed between the columnar conductor 43 and the electrode layers 50. In some embodiments, capacitances $C_2$ (e.g., via capacitors) are respectively interposed between the columnar conductor 45 and the electrode layers 50. In some embodiments, between the wiring 63 and the wiring 65, the capacitances $C_1$ are connected in series to the capacitances $C_2$ via the electrode layers 50. As a result, in some embodiments, the inter-terminal capacitance $C_{T1}$ of the capacitor CE1 can be represented by the following equation (1).

$$1/C_{T1}=1/\Sigma C_1+1/\Sigma C_2 \quad (1)$$

Here, $\Sigma$ represents the sum of respective capacitances. This is also equally represented with regard to the following capacitance values.

In some embodiments, as illustrated in FIG. 4, the wiring 63 includes, for example, a first portion 63a and a second portion 63b. For example, the first portion 63a extends in the X direction above the slit ST. In some embodiments, the second portion 63b extends in the Y direction from the first portion 63a above the columnar conductor 43. In some embodiments, the columnar conductor 43 is connected to the second portion 63b via the contact plug 49. In some embodiments, as shown in FIG. 4, the wirings 63 and 65 are partially cut out, and the cap layer 47 is omitted.

In some embodiments, the wiring 65 includes, for example, a first portion 65a and a second portion 65b. For example, the first portion 65a extends in the X direction above the slit ST. In some embodiments, the second portion 65b extends in the Y direction from the first portion 65a above the columnar conductor 45. In some embodiments, the columnar conductor 45 is connected to the second portion 65b via the contact plug 49.

In some embodiments, in the capacitor CE1, by changing, for example, the lengths of the first portions 63a and 65a and the number of second portions 63b and 65b, the number of columnar conductors 43 and 45 connected to the wirings 63 and 65 may be changed. Accordingly, it is possible to change the inter-terminal capacitance $C_{T1}$.

In some embodiments, the capacitor CE1 may be configured with the capacitances $C_1$ between the columnar conductor 43 and the electrode layers 50 and the capacitances $C_2$ between the columnar conductor 45 and the electrode layers 50. That is, by using the three-dimensionally distributed capacitances $C_1$ and $C_2$, the area of the capacitor CE1 that occupies the chip surface may be reduced to a range from 1/10 to 1/20, for example, compared with a case of using a two-dimensional capacitance that is provided in the X-Y plane. In some embodiments, the columnar conductors 43 and 45 and the electrode layers 50 may be formed at the same time as the channel layer 23, the word lines 20, and the selection gates 30 and 40 of the memory region MR, for example, and the manufacturing process may be simplified.

Figure 5:
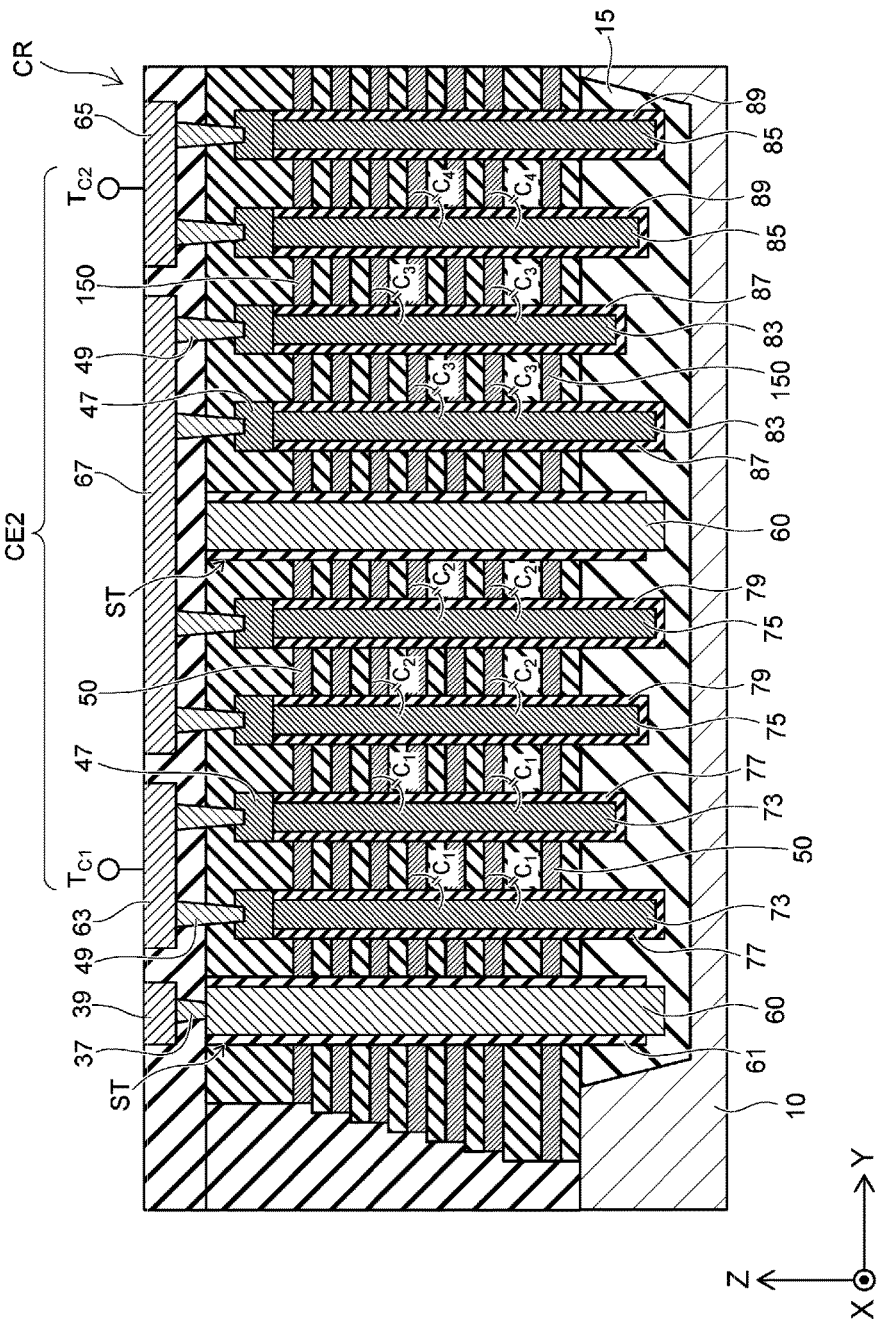
FIG. 5 is a schematic sectional view illustrating a capacitor according to some embodiments.
Figure 6:
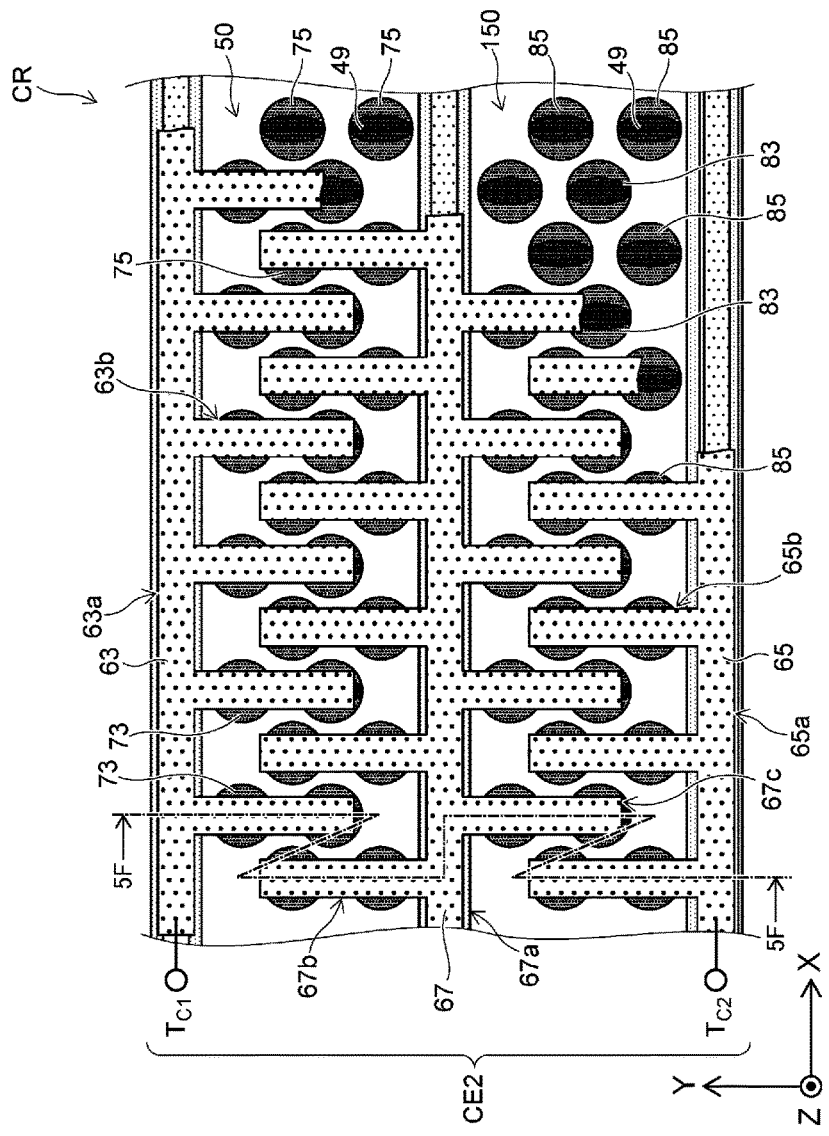
FIG. 6 is a schematic plan view illustrating wirings of the capacitor according to some embodiments.

FIG. 5 is a schematic sectional view illustrating a capacitor CE2 according to some embodiments. FIG. 6 is a schematic plan view illustrating wirings 63, 65 and 67 of the capacitor CE2. FIG. 5 is a cross-sectional view taken along line 5F-5F in FIG. 6. In some embodiments, the capacitor CE2 includes electrode layers 50 and 150, columnar conductors 73, 75, 83 and 85, and wirings 63, 65 and 67. In some embodiments, the wiring 63 is connected to the terminal $T_{C1}$, and the wiring 65 is connected to the terminal $T_{C2}$. In some embodiments, the insulating layer 15 (STI) is provided on the surface layer of the source layer 10.

In some embodiments, the electrode layers 50 may be, for example, metal layers including tungsten. In some embodiments, the electrode layers 50 may be low resistance polysilicon layers. In some embodiments, the columnar conductors 73, 75, 83 and 85 may include, for example, a metal such as tungsten. In some embodiments, the columnar conductors 73, 75, 83 and 85 may include, for example, polysilicon. In some embodiments, the wiring 67 may be, for example, a metal wiring including tungsten.

In some embodiments, the electrode layers 50 and 150 are respectively stacked on the source layer 10. In some embodiments, the electrode layers 150 are separated from the electrode layers 50 by the slit ST. In some embodiments, the electrode layers 50 and 150 extend respectively in the X direction along the slit ST.

In some embodiments, each of the columnar conductors 73 and 75 extends in the Z direction through the plurality of electrode layers 50. In some embodiments, an insulating layer 77 is provided between the columnar conductor 73 and the electrode layers 50. In some embodiments, the insulating layer 77 surrounds the side surface of the columnar conductor 73 and extends in the Z direction. In some embodiments, an insulating layer 79 is provided between the columnar conductor 75 and the electrode layers 50. In some embodiments, the insulating layer 79 surrounds the side surface of the columnar conductor 75 and extends in the Z direction. In some embodiments, the lower ends of the columnar conductors 73 and 75 are located, for example, in the insulating layer 15, and the columnar conductors 73 and 75 may be electrically insulated from the source layer 10 by the insulating layers 15 and 77 and the insulating layers 15 and 79, respectively. In some embodiments, the insulating layers 77 and 79 may be, for example, silicon oxide layers. In some embodiments, the insulating layers 77 and 79 may have, for example, a structure in which a plurality of insulating films are stacked.

In some embodiments, the columnar conductor 73 may be electrically connected to the wiring 63 via the cap layer 47 and the contact plug 49. In some embodiments, the columnar conductor 75 may be electrically connected to the wiring 67 via the cap layer 47 and the contact plug 49.

In some embodiments, each of the columnar conductors 83 and 85 extends in the Z direction through the plurality of electrode layers 150. In some embodiments, an insulating layer 87 is provided between the columnar conductor 83 and the electrode layers 150. In some embodiments, the insulating layer 87 surrounds the side surface of the columnar conductor 83 and extends in the Z direction. In some embodiments, an insulating layer 89 is provided between the columnar conductor 85 and the electrode layers 150. In some embodiments, the insulating layer 89 surrounds the side surface of the columnar conductor 85 and extends in the Z direction. In some embodiments, the lower ends of the columnar conductors 83 and 85 are located, for example, in the insulating layer 15, and the columnar conductors 83 and 85 are electrically insulated from the source layer 10 by the insulating layers 15 and 87 and the insulating layers 15 and 89, respectively. In some embodiments, the insulating layers 87 and 89 may be, for example, silicon oxide layers. In some embodiments, the insulating layers 87 and 89 may have, for example, a structure in which a plurality of insulating films are stacked.

In some embodiments, the columnar conductor 83 may be electrically connected to the wiring 67 via the cap layer 47 and the contact plug 49. In some embodiments, the columnar conductor 85 may be electrically connected to the wiring 65 via the cap layer 47 and the contact plug 49.

In some embodiments, as illustrated in FIG. 5, capacitances $C_1$ are interposed between the columnar conductor 73 and the electrode layers 50. In some embodiments, capacitances $C_2$ are interposed between the columnar conductor 75 and the electrode layers 50. In some embodiments, between the wiring 63 and the wiring 67, the capacitances $C_1$ are connected in series to the capacitances $C_2$ via the electrode layers 50.

In some embodiments, capacitances $C_3$ are interposed between the columnar conductor 83 and the electrode layers 150. In some embodiments, the capacitances $C_3$ are connected in series to the capacitances $C_2$ via the wiring 67. In some embodiments, capacitances $C_4$ are interposed between the columnar conductor 85 and the electrode layers 150. In some embodiments, between the wiring 67 and the wiring 65, the capacitances $C_3$ are connected in series to the capacitances $C_4$ via the electrode layers 150.

As a result, in some embodiments, the inter-terminal capacitance $C_{T2}$ of the capacitor CE2 can be represented by the following equation (2).

$$1/C_{T2}=1/\Sigma C_1+1/\Sigma C_2+1/\Sigma C_3+1/\Sigma C_4 \quad (2)$$

In some embodiments, as illustrated in FIG. 6, the wiring 63 includes, for example, the first portion 63a and the second portion 63b. For example, the first portion 63a extends in the X direction above the slit ST. In some embodiments, the second portion 63b extends in the Y direction from the first portion 63a above the columnar conductor 73. In some embodiments, the columnar conductor 73 is connected to the second portion 63b via the contact plug 49. In some embodiments, as shown in FIG. 6, a portion of the wirings 63, 65 and 67 is cut out and the cap layer 47 is omitted.

In some embodiments, the wiring 65 includes, for example, the first portion 65a and the second portion 65b. For example, the first portion 65a extends in the X direction above the slit ST. In some embodiments, the second portion 65b extends in the Y direction from the first portion 65a above the columnar conductor 85. In some embodiments, the columnar conductor 85 is connected to the second portion 65b via the contact plug 49.

In some embodiments, the wiring 67 includes, for example, a first portion 67a, a second portion 67b, and a third portion 67c. For example, the first portion 67a extends in the X direction above the slit ST. In some embodiments, the second portion 67b extends in the Y direction from the first portion 67a above the columnar conductor 75. In some embodiments, the columnar conductor 75 is connected to the second portion 67b via the contact plug 49. In some embodiments, the third portion 67c extends in the −Y direction from the first portion 67a above the columnar conductor 83. In some embodiments, the columnar conductor 83 is connected to the third portion 67c via the contact plug 49.

In some embodiments, in the capacitor CE2, for example, by changing the lengths of the first portions 63a, 65a and 67a, the number of second portions 63b, 65b and 67b, and the number of third portions 67c, the number of columnar conductors 73, 75, 83, and 85 to be connected to the wirings 63, 65 and 67 may be changed. Thus, the inter-terminal capacitance $C_{T2}$ may be changed.

In some embodiments, capacitances $C_1$, $C_2$, $C_3$ and $C_4$ are connected in series between the terminal $T_{C1}$ and the terminal $T_{C2}$. In some embodiments, assuming that the capacitances $C_1$, $C_2$, $C_3$, and $C_4$ have the same breakdown voltage, the capacitor CE2 may have the breakdown voltage twice that of the capacitor CE1. That is, by increasing the number of capacitances connected in series between the columnar conductor and the electrode layers, a capacitor having a high breakdown voltage can be achieved.

Figure 7:
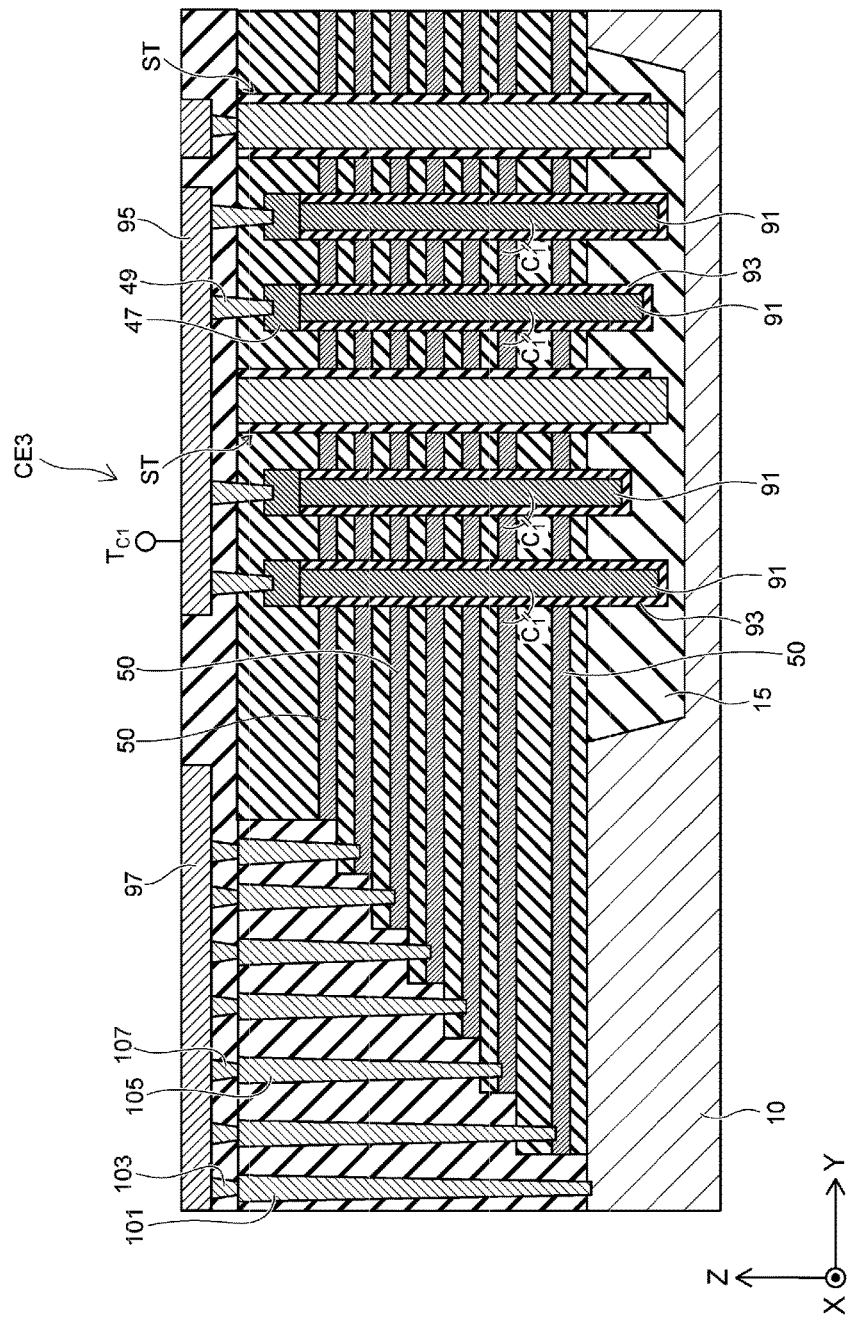
FIG. 7 is a schematic sectional view illustrating a capacitor according to some embodiments.
Figure 8:
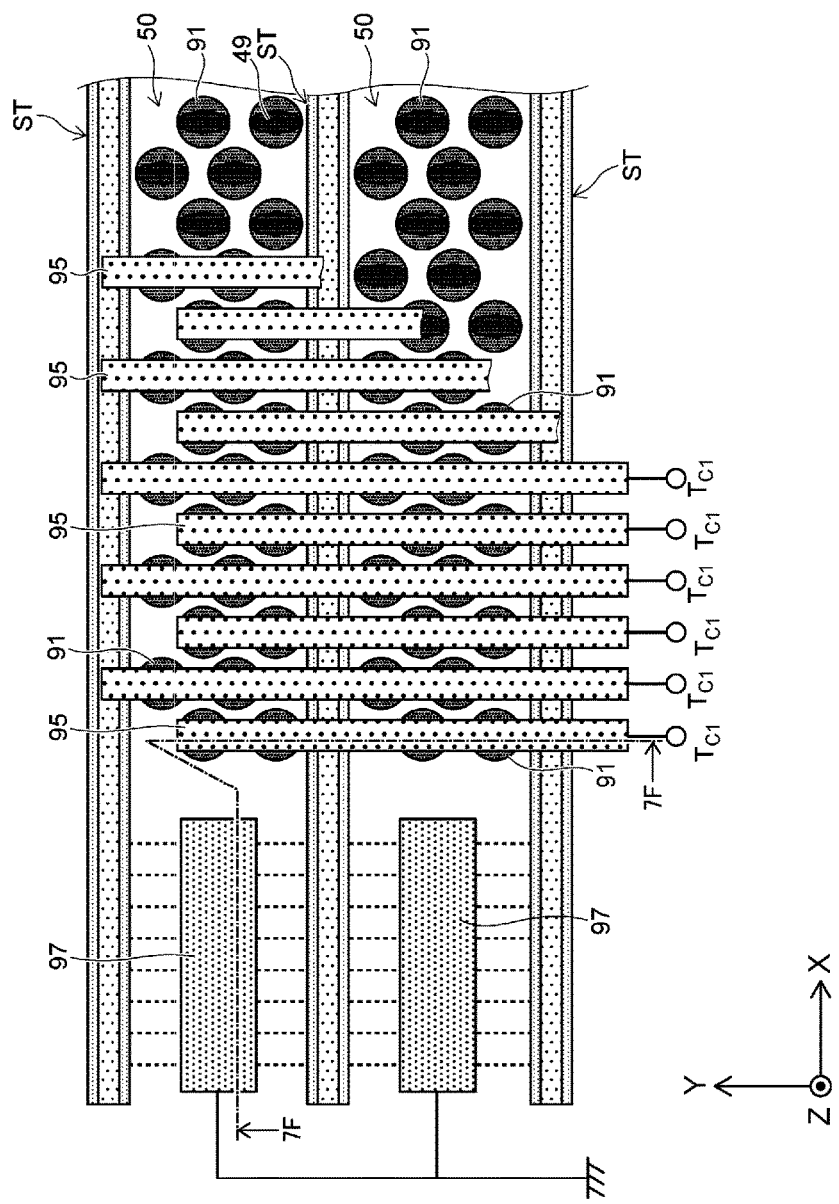
FIG. 8 is a schematic plan view illustrating wirings of the capacitor according to some embodiments.

FIG. 7 is a schematic sectional view illustrating a capacitor CE3 according to some embodiments. FIG. 8 is a schematic plan view illustrating wirings of the capacitor CE3. FIG. 7 is a cross-sectional view taken along line 7F-7F illustrated in FIG. 8. In some embodiments, the capacitor CE3 includes the electrode layers 50, a columnar conductor 91, and wirings 95 and 97. In some embodiments, the wiring 95 is connected to the terminal $T_{C1}$, and the wiring 97 may be electrically connected to the source layer 10 via contact plugs 101 and 103. In some embodiments, the electrode layers 50 are provided in a stepwise shape at the ends thereof, and each electrode layer 50 may be electrically connected to the wiring 97 via contact plugs 105 and 107. In some embodiments, the wirings 95 and 97 may be metal wirings including, for example, tungsten. In some embodiments, the contact plugs 101, 103, 105 and 107 may include, for example, a metal such as tungsten.

In some embodiments, the electrode layers 50 are stacked on the source layer 10 including the insulating layer 15. In some embodiments, the columnar conductor 91 extends in the Z direction through the plurality of electrode layers 50 in the portion thereof in which the insulating layer 15 is provided. In some embodiments, the lower end of the columnar conductor 91 is located, for example, in the insulating layer 15. Thus, the columnar conductor 91 may be electrically insulated from the source layer 10, in some embodiments. In some embodiments, the columnar conductor 91 may be electrically connected to the wiring 95 via the cap layer 47 and the contact plug 49 provided at the upper end thereof. In some embodiments, the columnar conductor 91 may include, for example, a metal such as tungsten. In some embodiments, the columnar conductor 91 may include, for example, polysilicon.

In some embodiments, an insulating layer 93 is provided between the columnar conductor 91 and the electrode layers 50. In some embodiments, the insulating layer 93 surrounds the side surface of the columnar conductor 91 and extends in the Z direction. In some embodiments, the insulating layer 93 may be, for example, a silicon oxide layer. In some embodiments, the insulating layer 93 may have, for example, a structure in which a plurality of insulating films are stacked. In some embodiments, between the columnar conductor 91 and the electrode layers 50, a capacitance $C_1$ is interposed. In some embodiments, between the wiring 95 and the wiring 97, a plurality of capacitances $C_1$ are arranged in parallel. In some embodiments, the capacitor CE3 may have a capacitance $\Sigma C_1$ between the terminal $T_{C1}$ and the wiring 97.

In some embodiments, as illustrated in FIG. 8, for example, the wiring 95 is provided so as to cross the electrode layers 50, which extend in the X direction, and extends in the Y direction above the columnar conductor 91. In some embodiments, the columnar conductor 91 is connected to the wiring 95 via the contact plug 49. In some embodiments, as shown in FIG. 8, a portion of the wiring 95 is cut out and the cap layer 47 is omitted.

In some embodiments, a plurality of wirings 95 are provided and are each connected to the terminal $T_{C1}$. In some embodiments, the capacitor CE3 is provided for each wiring 95. In some embodiments, the capacitor CE3 may have a capacitance value depending on the number of columnar conductors 91 connected thereto. In some embodiments, the wiring 97 may be connected to a ground potential.

Figure 9:
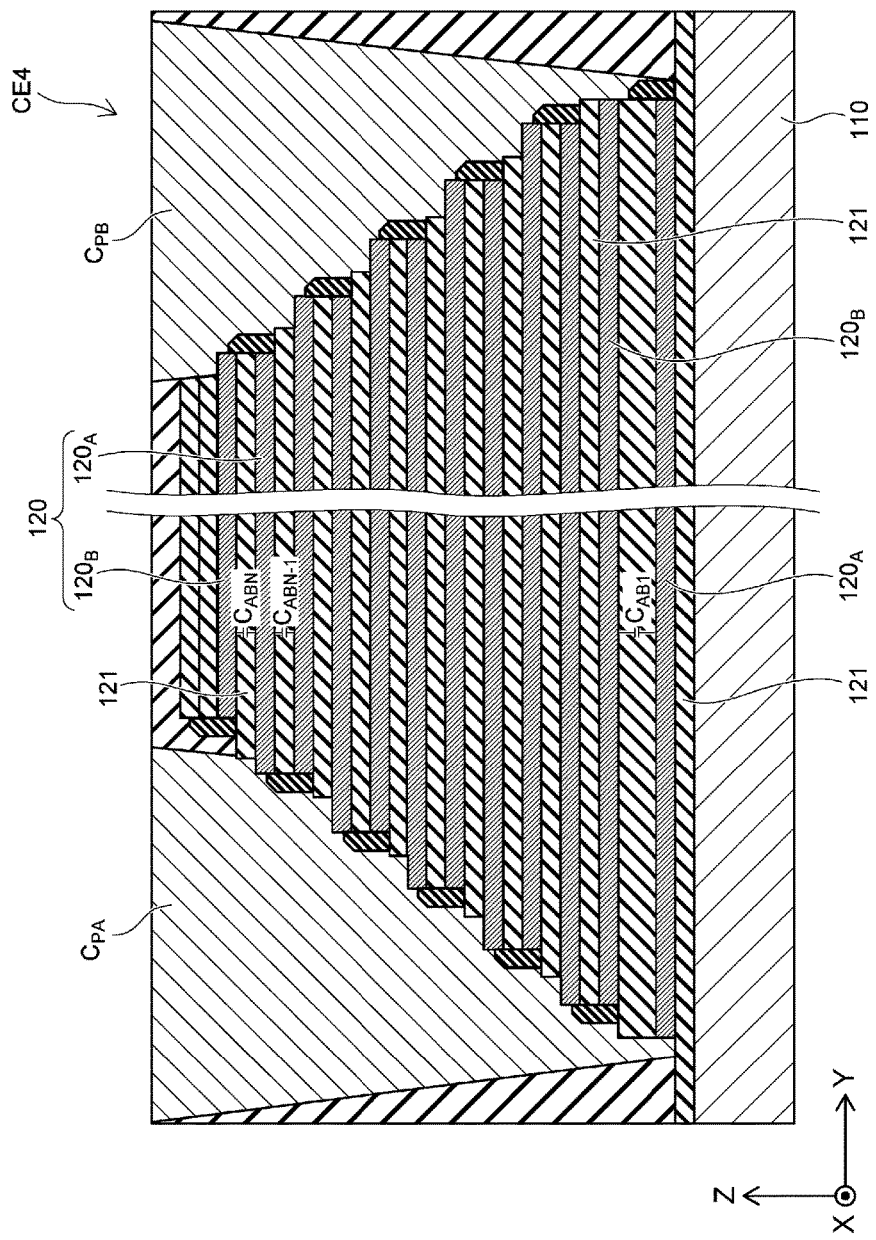
FIG. 9 is a schematic sectional view illustrating a capacitor according to some embodiments.

FIG. 9 is a schematic sectional view illustrating a capacitor CE4 according to some embodiments. In some embodiments, the capacitor CE4 includes a plurality of electrode layers 120 stacked in the Z direction and contact plugs $C_{PA}$ and $C_{PB}$.

For example, the electrode layers 120 are stacked on a source layer 110 via an interlayer insulating layer 121. In some embodiments, the source layer 110 may be, for example, a conductive layer provided on the surface layer of a substrate. In some embodiments, each electrode layer 120 has two ends formed in the form of a step and may be electrically connected to the contact plugs $C_{PA}$ and $C_{PB}$. In some embodiments, the electrode layers 120 include electrode layers $120_A$ each connected to a contact plug $C_{PA}$ and electrode layers $120_B$ each connected to a contact plug $C_{PB}$. In some embodiments, the electrode layers $120_A$ and $120_B$ are alternately stacked.

In some embodiments, the electrode layers 120 may be, for example, metal layers including tungsten or the like. In some embodiments, the electrode layers 120 may be, for example, low resistance polysilicon layers. In some embodiments, the interlayer insulating layers 121 may be, for example, silicon oxide layers. In some embodiments, an inter-electrode capacitance $C_{AB}$ is interposed between the electrode layers $120_A$ and the electrode layers $120_B$. In some embodiments, the capacitor CE4 may have a capacitance $\Sigma C_{ABN}$ between the contact plugs $C_{PA}$ and $C_{PB}$. Here, N is a positive integer and $C_{ABN}$ is the inter-electrode capacitance that is located at the Nth position from the source layer 110.

Figure 10:
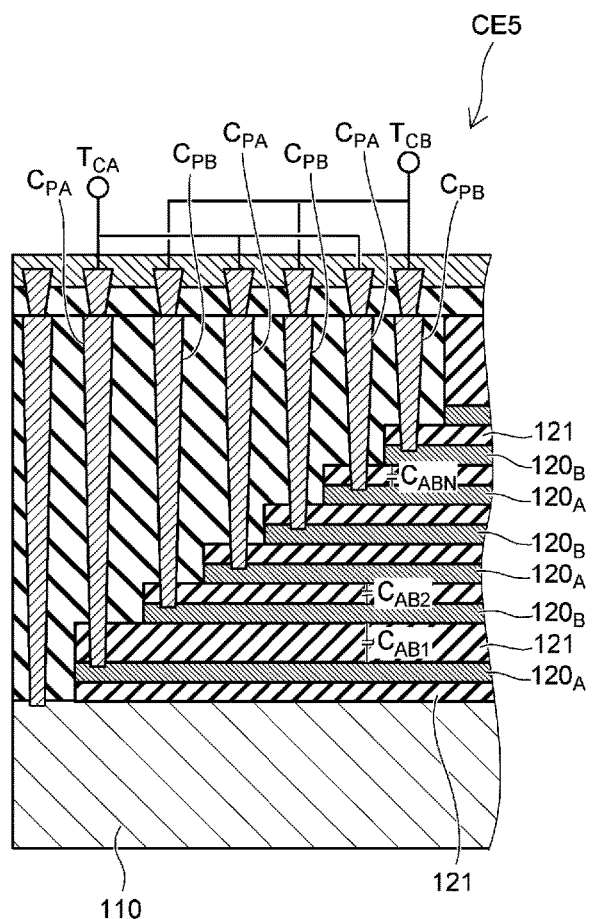
FIG. 10 is a schematic sectional view illustrating a capacitor according to a comparative example.

FIG. 10 is a schematic sectional view illustrating a capacitor CE5 according to a comparative example. The capacitor CE5 includes a plurality of electrode layers 120 stacked in the Z direction, a plurality of contact plugs $C_{PA}$, and a plurality of contact plugs $C_{PB}$.

For example, referring to FIG. 10, the electrode layers 120 are stacked on the source layer 110 via the interlayer insulating layer 121. The electrode layers 120 have ends formed in a stepwise shape and are electrically connected to the contact plugs $C_{PA}$ and $C_{PB}$, respectively. The electrode layers 120 includes electrode layers $120_A$ each connected to a contact plug $C_{PA}$ and electrode layers $120_B$ each connected to a contact plug $C_{PB}$. The electrode layers $120_A$ and $120_B$ are alternately stacked. The contact plug $C_{PA}$ is connected to the terminal $T_{CA}$, and the contact plug $C_{PB}$ is connected to the terminal $T_{CB}$. The capacitor CE5 has a capacitance $\Sigma C_{ABN}$ between the terminals $T_{CA}$ and $T_{CB}$.

Referring to FIG. 10, in the capacitor CE5, in the end of each of the electrode layer 120, each electrode layer 120 and one contact plug $C_{PA}$ or $C_{PB}$ are connected to each other. Therefore, in this comparative example, in the end of each electrode layer 120, a step width including the connection margin with the contact plug $C_{PA}$ or $C_{PB}$ is included. Therefore, when the number of stacked electrode layers 120 increases, the step width in the Y direction increases and the occupation area of the capacitor CE5 in the chip surface increases.

In some embodiments, in the capacitor CE4 (e.g., see FIG. 9), one contact plug $C_{PA}$ or $C_{PB}$ is connected to each of the electrode layers $120_A$ and $120_B$. Therefore, the connection margin may be reduced, so that the step width of the electrode layers 120 may be reduced. Thus, the occupation area of the capacitor CE4 in the chip surface may be reduced.

Next, a method of manufacturing the capacitor CE4 will be described with reference to FIG. 11 to FIG. 18B. FIG. 11 to FIG. 18B are schematic sectional views illustrating a process of manufacturing the capacitor CE4 according to some embodiments.

Figure 11:
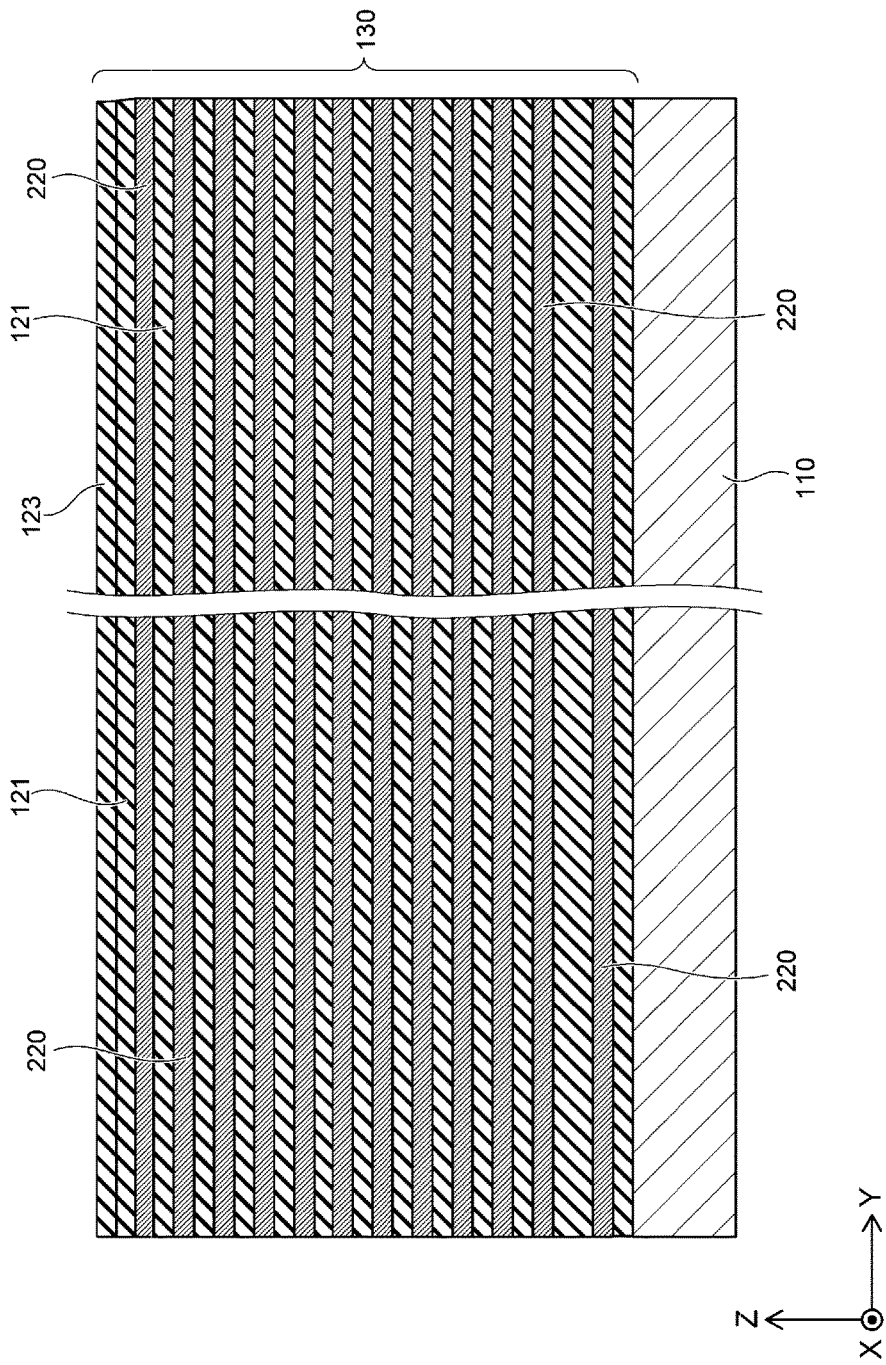
FIG. 11 is a schematic sectional view illustrating a process of manufacturing the capacitor according to some embodiments.

FIG. 11 is a schematic sectional view illustrating a stacked body 130 formed on the source layer 110. In some embodiments, the stacked body 130 includes a plurality of interlayer insulating layers 121, a plurality of conductive layers 220, and an insulating layer 123. In some embodiments, the interlayer insulating layers 121 and the conductive layers 220 are alternately stacked in the Z direction. In some embodiments, the interlayer insulating layers 121 may be, for example, silicon oxide layers, and the conductive layers 220 may be, for example, metal layers including tungsten. In some embodiments, the insulating layer 123 may be, for example, a silicon nitride layer, and is formed on the uppermost layer of the interlayer insulating layers 121.

Figure 12A:
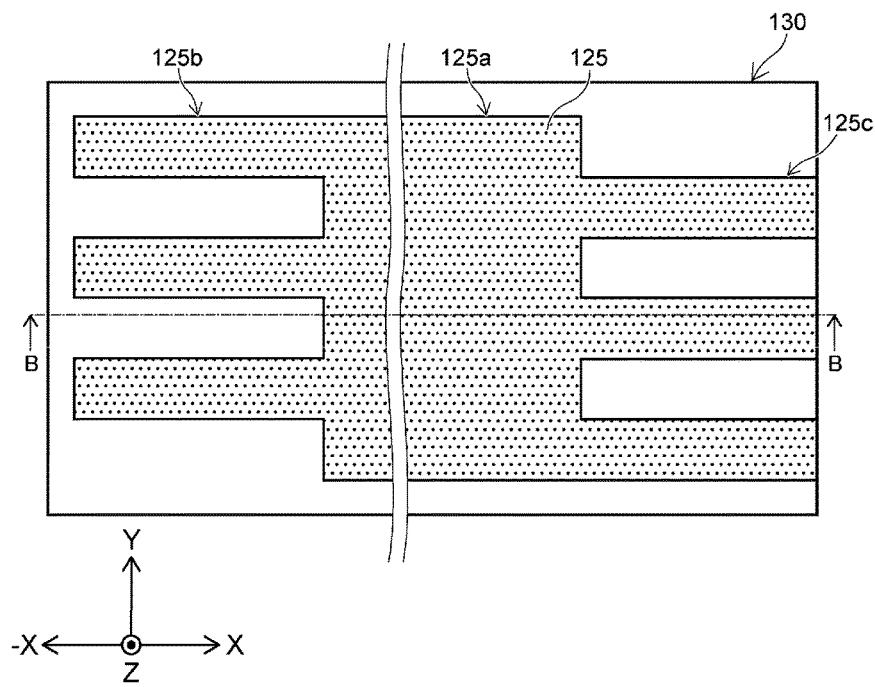
FIG. 12A and FIG. 12B are schematic views illustrating a manufacturing process subsequent to FIG. 11.
Figure 12B:
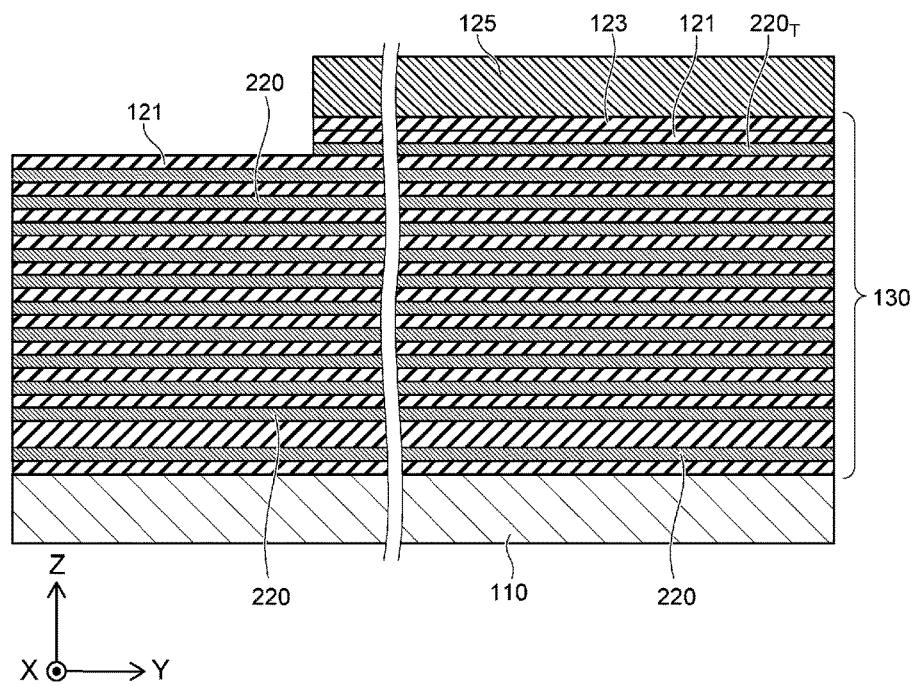

FIG. 12A is a schematic plan view illustrating the upper surface of the stacked body 130. FIG. 12B is a schematic sectional view of the stacked body 130 taken along line B-B illustrated in FIG. 12A. In some embodiments, a mask 125 is provided on the upper surface of the stacked body 130. In some embodiments, the mask 125 may be, for example, a photoresist and may be patterned into a predetermined shape using photolithography.

In some embodiments, as illustrated in FIG. 12A, the mask 125 includes a first portion 125a, a second portion 125b, and a third portion 125c. In some embodiments, the second portion 125b extends in the −X direction from the first portion 125a, and the third portion 125c extends in the X direction from the first portion 125a. In some embodiments, the second and third portions 125b and 125c are alternately arranged in the Y direction and are provided so as to extend in the —X direction and the X direction, respectively.

In some embodiments, as illustrated in FIG. 12B, the insulating layer 123, the interlayer insulating layer 121, and a conductive layer $220_T$ are selectively removed by dry etching using the mask 125 so as to form a first step. In some embodiments, the conductive layer $220_T$ is the uppermost layer of the conductive layers 220. In some embodiments, this etching is performed, for example, under the condition in which the insulating layers 123 and 121 are selectively removed with respect to the conductive layer $220_T$, and thereafter the conductive layer $220_T$ is selectively removed with respect to the interlayer insulating layer 121. In some embodiments, a subsequent etching may be performed in the same manner.

Figure 13A:
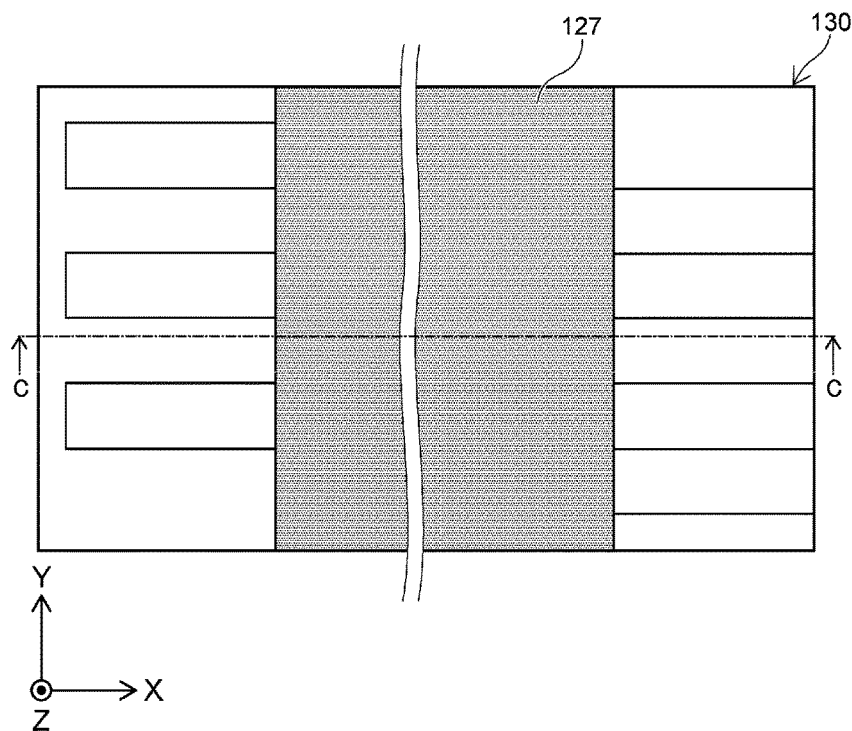
FIG. 13A and FIG. 13B are schematic views illustrating a manufacturing process subsequent to FIG. 12A and FIG. 12B, respectively.
Figure 13B:
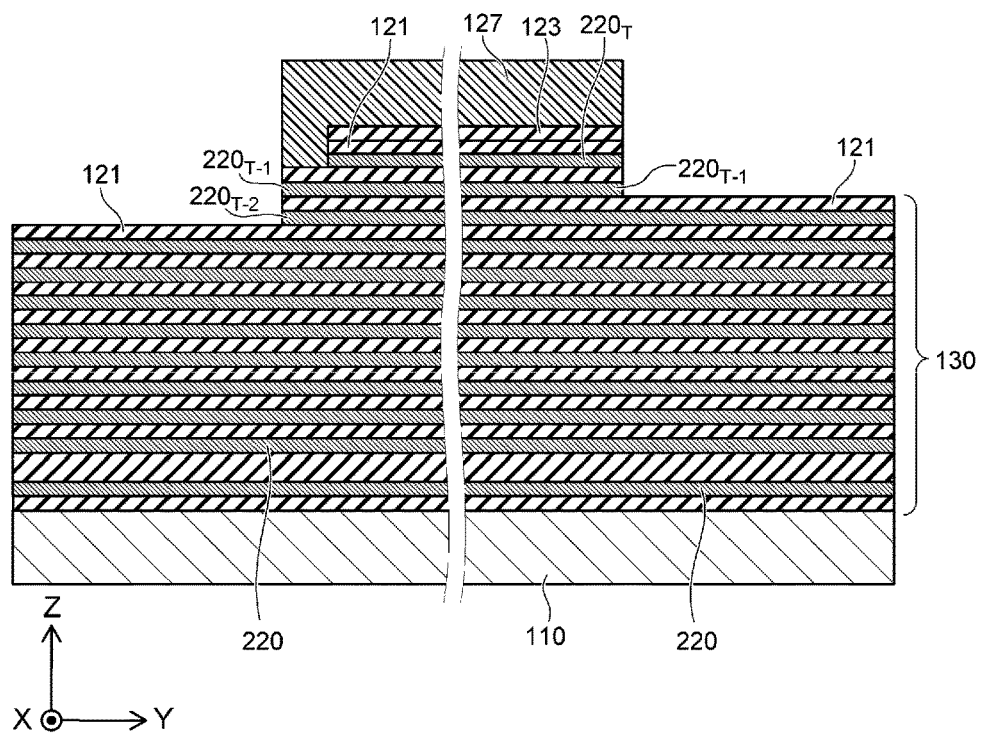

FIG. 13A is a schematic plan view illustrating the upper surface of the stacked body 130. FIG. 13B is a schematic sectional view of the stacked body 130 taken along line C-C illustrated in FIG. 13A. In some embodiments, a mask 127 is provided on the upper surface of the stacked body 130.

In some embodiments, the mask 127 illustrated in FIG. 13A has a width in the X-direction, which may be wider than the first portion 125a of the mask 125 (see FIG. 12A). In some embodiments, in the etching illustrated in FIG. 12B, the mask 127 may cover the first step formed on the left end of the conductive layer $220_T$.

In some embodiments, as illustrated in FIG. 13B, the conductive layer $220_{T-1}$ and the conductive layer $220_{T-2}$ are selectively removed from the left side of the mask 127. In some embodiments, the conductive layer $220_T$ and the conductive layer $220_{T-1}$ are selectively removed from the right side of the mask 127. Thereby, in some embodiments, a second step is formed on the right ends of the conductive layers $220_T$ and $220_{T-1}$, and a third step is formed on the left ends of the conductive layers $220_{T-1}$ and $220_{T-2}$.

Figure 14A:
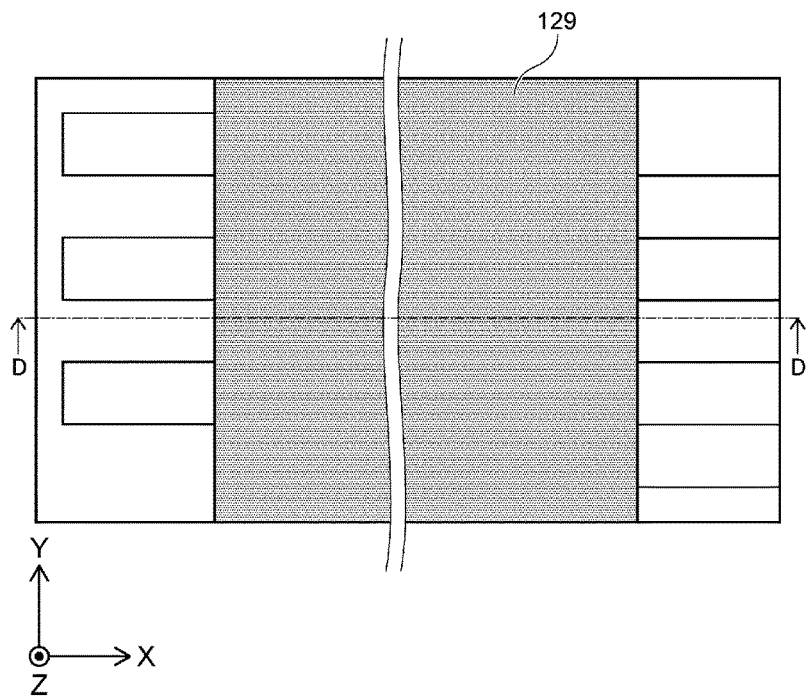
FIG. 14A and FIG. 14B are schematic views illustrating a manufacturing process subsequent to FIG. 13A and FIG. 13B, respectively.
Figure 14B:
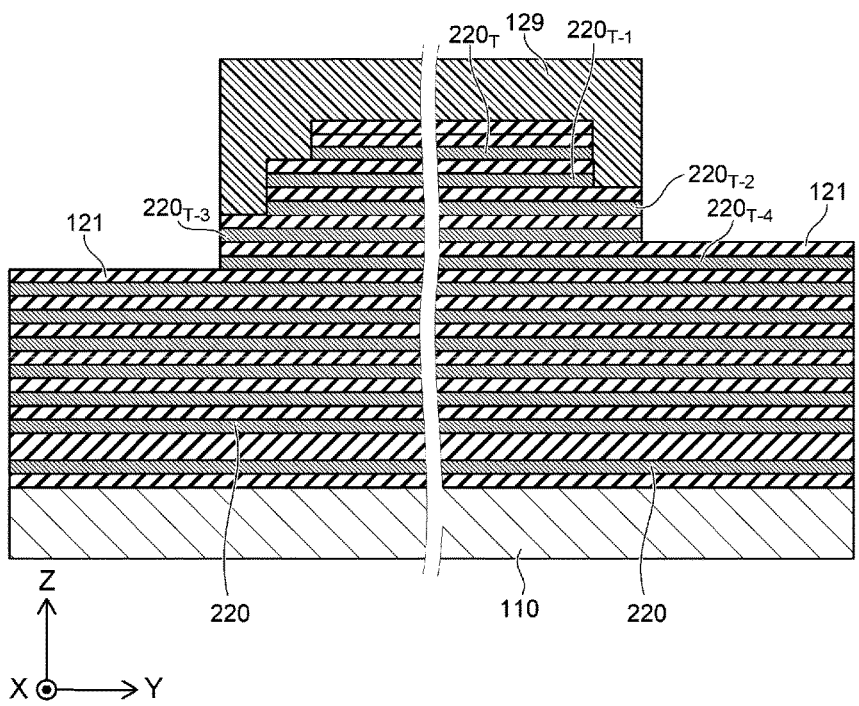

FIG. 14A is a schematic plan view illustrating the upper surface of the stacked body 130. FIG. 14B is a schematic sectional view of the stacked body 130 taken along line D-D illustrated in FIG. 14A. In some embodiments, a mask 129 is provided on the upper surface of the stacked body 130.

In some embodiments, as illustrated in FIG. 14A, the mask 129 may have a wider width in the X-direction than that of the mask 127 (see FIG. 13A), and covers the first step, the second step, and the third step formed in the etching process illustrated in FIG. 13B.

In some embodiments, as illustrated in FIG. 14B, the conductive layer $220_{T-2}$ and the conductive layer $220_{T-3}$ are selectively removed from the right side of the mask 129 so as to form a fourth step. In some embodiments, the conductive layer $220_{T-3}$ and the conductive layer $220_{T-4}$ are selectively removed from the left side of the mask 129 so as to form a fifth step.

In some embodiments, by repeating the formation of the mask on the upper surface of the stacked body 130 and the selective etching of the conductive layers 220, the right end and the left end of the stacked body 130 are processed in the form of a step.

Figure 15A:
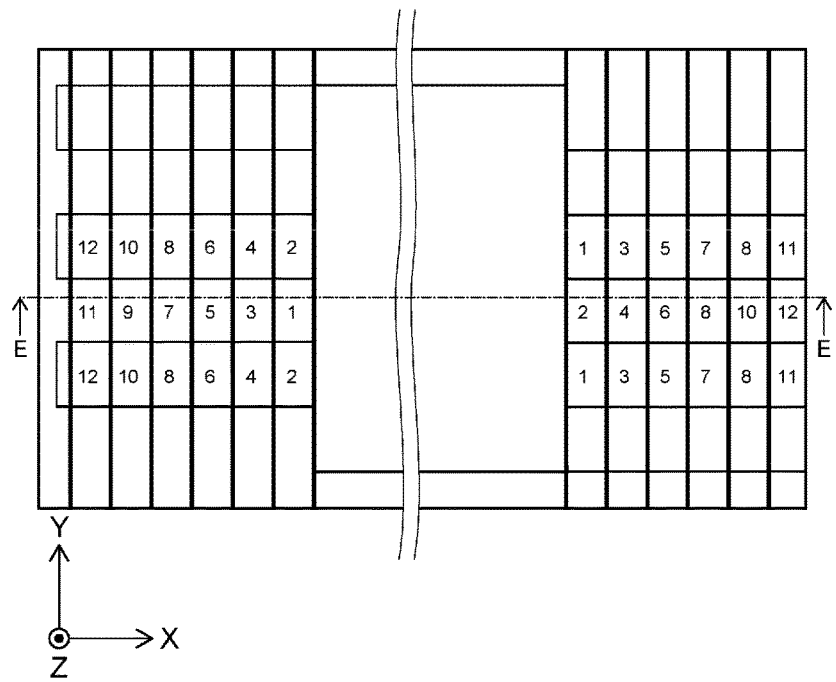
FIG. 15A and FIG. 15B are schematic views illustrating a manufacturing process subsequent to FIG. 14A and FIG. 14B, respectively.
Figure 15B:
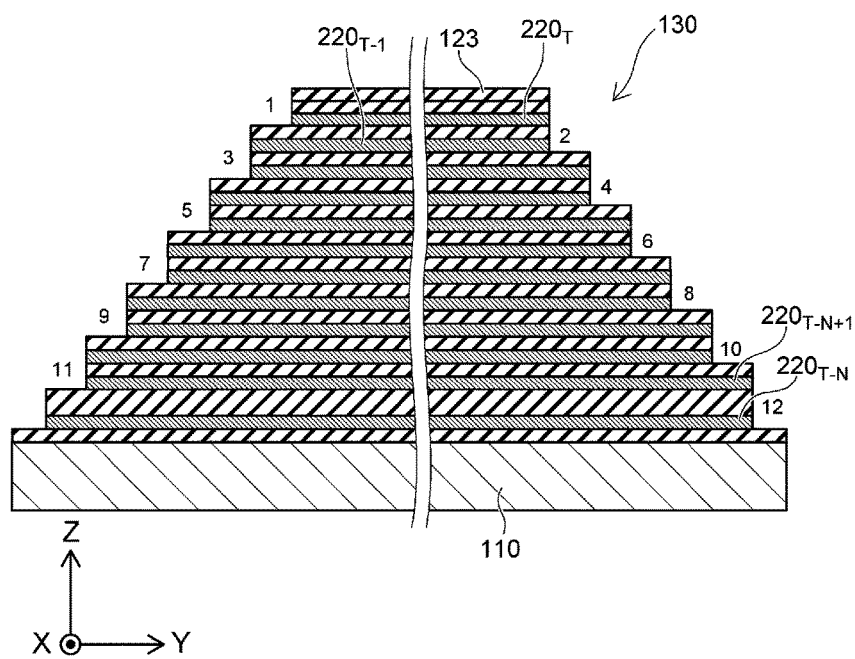

FIG. 15A is a schematic plan view illustrating the upper surface of the stacked body 130 having the right end and the left end formed in a stepwise shape. FIG. 15B is a cross-sectional view of the stacked body 130 taken along line E-E illustrated in FIG. 15A.

In some embodiments, as illustrated in FIG. 15A, for example, first to twelfth steps are formed on the right end and the left end of the stacked body 130. In some embodiments, by using the mask 125 illustrated in FIG. 12A, the arrangement of the odd-numbered steps and the even-numbered steps are alternated in the Y-direction on the right end and the left end of the stacked body 130.

In some embodiments, as illustrated in FIG. 15B, the first step includes the end faces of one conductive layer $220_T$, and each of the second to twelfth steps (N=11) includes the end faces of two conductive layers 220.

Figure 16:
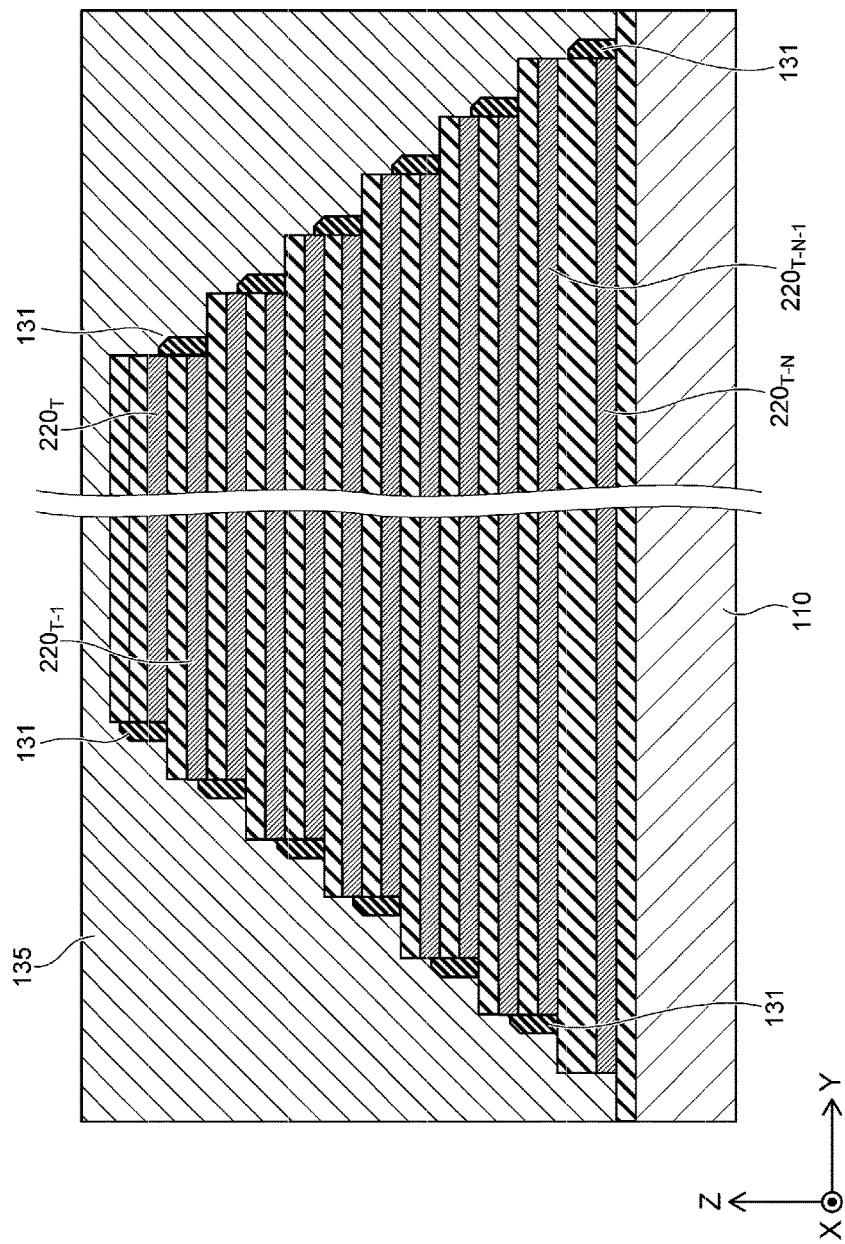
FIG. 16 is a schematic sectional view illustrating a manufacturing process subsequent to FIG. 15A and FIG. 15B.

FIG. 16 is a schematic sectional view illustrating the stacked body 130 on which the first to twelfth steps are formed. In some embodiments, an insulating layer 131 is formed on each step. In some embodiments, an insulating layer 135 is formed to cover the stacked body 130. In some embodiments, the insulating layer 131 may be, for example, a silicon nitride layer, and the insulating layer 135 may be, for example, a silicon oxide layer. In some embodiments, the upper surface of the insulating layer 135 may be planarized by, for example, chemical mechanical polishing (CMP).

In some embodiments, the insulating layer 131 is formed, for example, by forming a silicon nitride layer that covers the stacked body 130 and selectively removing the silicon nitride layer by anisotropic dry etching while leaving the portion thereof that is formed on the side surfaces of the first to twelfth steps. In some embodiments, in each of the second to twelfth steps, the insulating layer 131 is formed so that the end surface of the uppermost layer of the vertically stacked conductive layers 220 is exposed.

Figure 17:
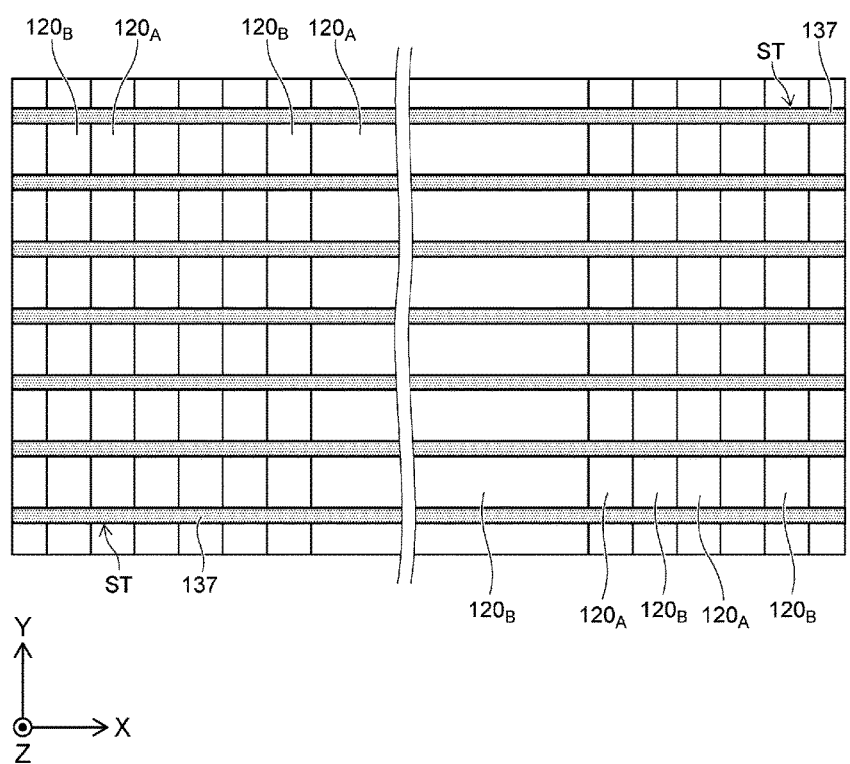
FIG. 17 is a schematic plan view illustrating a manufacturing process subsequent to FIG. 16.

FIG. 17 is a schematic plan view illustrating the upper surface of the stacked body 130 covered with the insulating layer 135. In some embodiments, as illustrated in FIG. 17, slits ST are formed to extend from the upper surface of the insulating layer 135 to the source layer 110. In some embodiments, insulating layers 137 are formed inside the slits ST.

In some embodiments, referring to FIG. 17, the slits ST are formed in the boundaries of the portions in which the odd-numbered steps and the even-numbered steps of the first to twelfth steps are alternated with each other in the Y-direction (see FIG. 15A). In some embodiments, the conductive layers 220 divided by the slits ST become the electrode layers $120_A$ and $120_B$ (see FIG. 9).

Figure 18A:
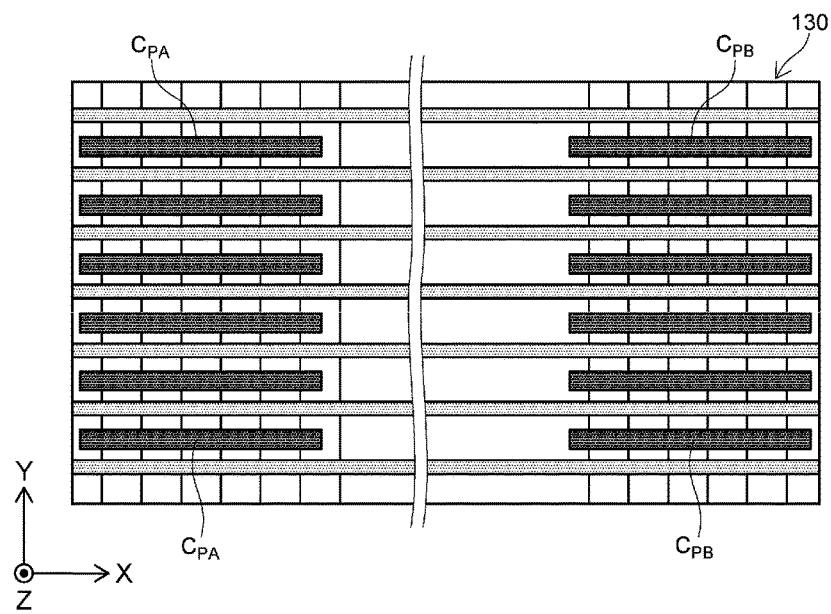
FIG. 18A and FIG. 18B are schematic views illustrating a manufacturing process subsequent to FIG. 17.

FIG. 18A is a schematic plan view illustrating the contact plugs $C_{PA}$ and $C_{PB}$ electrically connected to the stacked body 130. In some embodiments, the contact plugs $C_{PA}$ and $C_{PB}$ may be metal layers provided in contact holes, which communicate with the ends of the stacked body 130. In some embodiments, the contact plugs $C_{PA}$ and $C_{PB}$ may include, for example, tungsten. In some embodiments, as illustrated in FIG. 18A, between the slits ST, the contact plug $C_{PA}$ is provided in one end of the stacked body 130, and the contact plug $C_{PB}$ is provided in the other end.

Figure 18B:
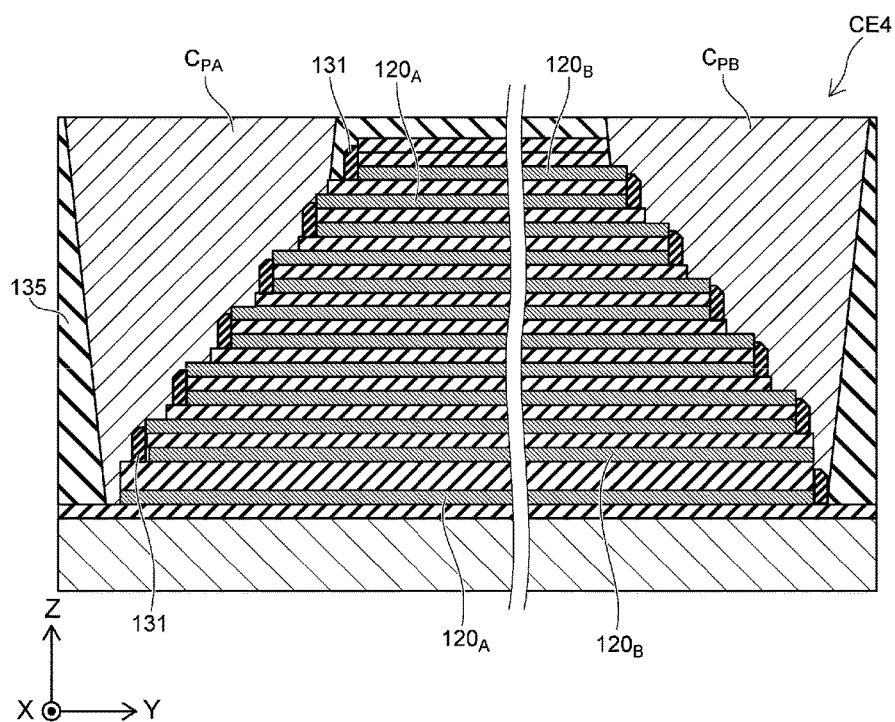

In some embodiments, as illustrated in FIG. 18B, the contact plug $C_{PA}$ may be electrically connected to a portion of each of the electrode layers $120_A$ that are exposed from the stepped ends of the stacked body 130. In some embodiments, the insulating layers 131 cover the ends of the electrode layers $120_B$ so as to electrically insulate the electrode layers $120_B$ from the contact plug $C_{PA}$. In some embodiments, the contact plug $C_{PB}$ may be electrically connected to a portion of each of the electrode layer $120_B$ that is exposed from the stepwise end of the stacked body 130. In some embodiments, the insulating layer 131 covers the ends of the electrode layers $120_A$ so as to electrically insulate the electrode layers $120_A$ from the contact plug $C_{PB}$.

Figure 19A:
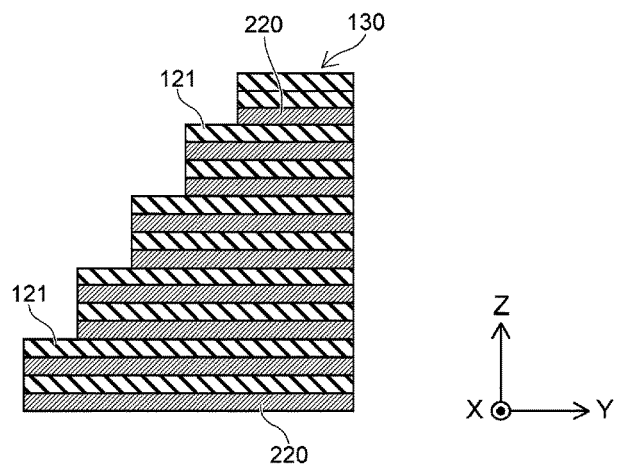
FIG. 19A, FIG. 19B and FIG. 19C are schematic sectional views illustrating a process of manufacturing a capacitor according to some embodiments.
Figure 19B:
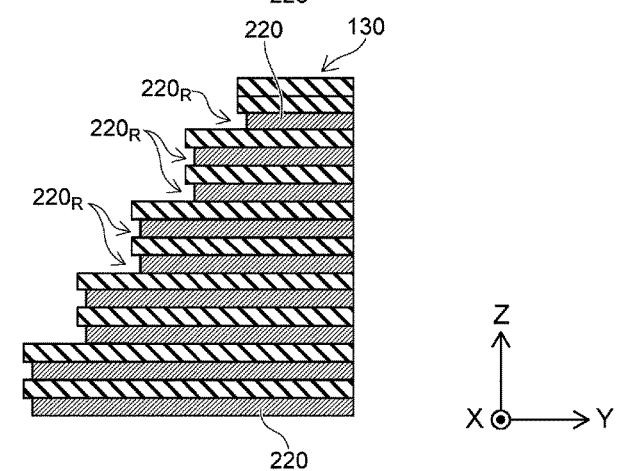
Figure 19C:
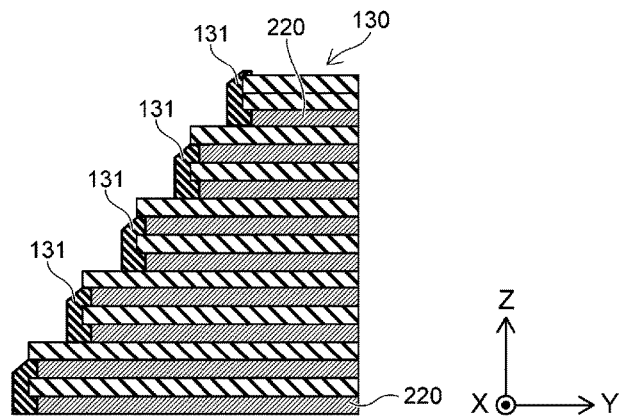

Next, a method of manufacturing the capacitor CE4 according to some embodiments will be described with reference to FIG. 19A, FIG. 19B and FIG. 19C. FIG. 19A, FIG. 19B and FIG. 19C are schematic sectional views illustrating the process of manufacturing the capacitor CE4 according to some embodiments. FIG. 19A, FIG. 19B and FIG. 19C are schematic sectional views illustrating a portion of the stacked body 130.

In some embodiments, as illustrated in FIG. 19A, first to twelfth steps are formed on the ends of the stacked body 130 (see also FIG. 15B). Subsequently, in some embodiments, as illustrated in FIG. 19B, each end of the conductive layers 220 is etched to form a recessed portion $220_R$. In some embodiments, the recessed portion $220_R$ may be formed by, for example, isotropic etching such as wet etching. In some embodiments, this etching may be performed under the condition in which the interlayer insulating layers 121 have sufficient etching resistance.

In some embodiments, as illustrated in FIG. 19C, the insulating layer 131 is formed so as to be embedded in the recessed portions $220_R$ therein. In some embodiments, compared with the example illustrated in FIG. 16, the insulating layers 131 may be formed to be selectively thick in the portions thereof that are embedded in the recessed portions $220_R$. Thus, the insulation breakdown voltage between the contact plugs $C_{PA}$ and $C_{PB}$ and the electrode layers 120 may be increased. That is, the capacitor CE4 having a higher insulation breakdown voltage can be achieved.

In some embodiments, in the capacitor CE4, the slits ST need not to be linearly formed. In some embodiments, the number and the shape of the slits ST may be changed according to the capacitance value determined in the design of the capacitor CE4.

In some embodiments, in the capacitor CE4, the first to twelfth steps may be formed using pairs of two conductive layers 220, and each insulating layer 131 may be formed on the lower layer side of the pair having the end surface exposed in each step. Thus, the contact plugs $C_{PA}$ and $C_{PB}$ may be respectively connected to the even layers and the odd layers of the electrode layers 120 in a self-aligning manner. As a result, it is possible to considerably reduce the area of the stepped ends, compared to a case where a contact plug is individually connected to each of the steps. In some embodiments, since the memory region and the capacitor CE4 may be formed separately by only patterning the conductive layer 220 and the insulating layer 135, it is possible to simplify a manufacturing process and to reduce manufacturing costs.

Figure 20:
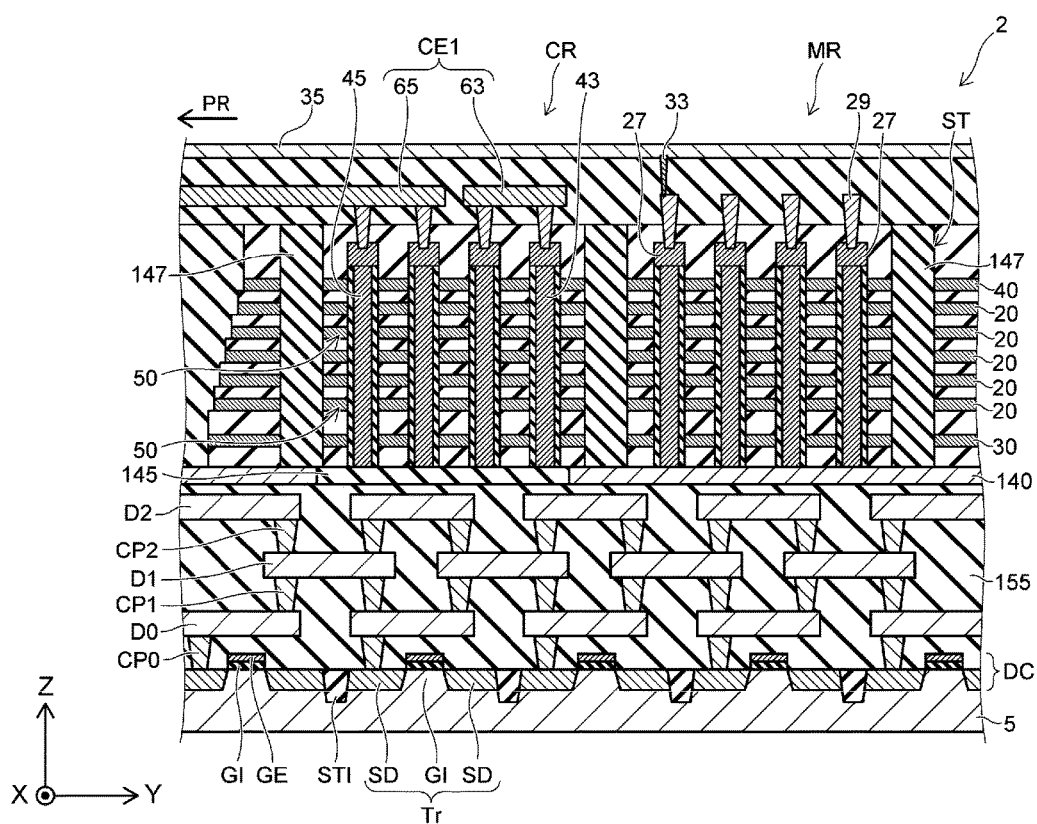
FIG. 20 is a schematic sectional view illustrating a storage device according to some embodiments.

FIG. 20 is a schematic sectional view illustrating a storage device 2 according to some embodiments. In some embodiments, the storage device 2 includes a substrate 5 in which a circuit DC is provided on the surface layer to drive memory cells, and the memory region MR provided above the circuit DC. In some embodiments, wirings D0, D1 and D2 and a source line 140 are arranged between the memory region MR and the circuit DC.

In some embodiments, the circuit DC includes a plurality of transistors Tr, and each two adjacent transistors Tr may be electrically insulated from each other by a slit STI. In some embodiments, the transistors Tr may be, for example, MOS type FETs, each of which includes a source/drain region SD, a gate electrode GE, and a gate insulating film GI, and the source/drain region SD may be electrically connected to the wiring D0 via, for example, a contact plug CP0. In some embodiments, the gate electrode GE may be also electrically connected to another wiring D0 in a portion (not illustrated). In some embodiments, the wirings D0, D1 and D2 are connected to each other via the contact plugs CP1 and CP2. In some embodiments, the wirings D0, D1 and D2 and the source line 140 may be electrically insulated by an interlayer insulating film 155.

In some embodiments, the source line 140 is located between the wiring D2 and the selection gate 30, and may be provided in a plate shape, which spreads in the X direction and the Y direction, for example. In some embodiments, the word lines 20 and the selection gates 30 and 40 are stacked on the source line 140 via an interlayer insulating film.

In some embodiments, the storage device 2 further includes a capacitor CE1 arranged in a passive region CR. In some embodiments, the capacitor CE1 includes columnar conductors 43 and 45 disposed on the insulating layer 145. In some embodiments, the columnar conductors 43 and 45 are respectively connected to the wirings 63 and 65. In some embodiments, the insulating layer 145 is, for example, disposed to be embedded inside an opening formed in the source line 140.

In some embodiments, the electrode layers 50 of the capacitor CE1 are stacked above the insulating layer 145. In some embodiments, the electrode layers 50 may be formed simultaneously with the word lines 20 and the selection gates 30 and 40, and each electrode layer 50 is located at substantially the same level as any one of the word lines 20 and the selection gates 30 and 40 (e.g. at the level at which the height in the Z-direction from the source line 140 is substantially the same or where a first height varies by less than or equal to ±10% of a second height, such as less than or equal to ±5%, less than or equal to ±4%, less than or equal to ±3%, less than or equal to ±2%, or less than or equal to ±1%).

As illustrated in FIG. 20, in some embodiments, in the storage device 2, the conductor 60 (see FIG. 5) is not provided and the insides of the slits ST are embedded by an insulating layer 147. In some embodiments, the insulating layer 147 may electrically insulate the word lines 20 from each other and electrically insulate selection gates from each other, which are adjacent in the Y-direction. In some embodiments, the insulating layer 147 may electrically insulate the capacitor CE1 and the memory region MR from each other.

In some embodiments, by disposing the circuit DC under the memory region MR and the capacitor CE1, the capacitance of the storage device 2 may be increased or the chip size may be reduced. Other embodiments are not limited to the above example, and for example, the capacitor CE1 may be replaced with the capacitor CE4.

In the description of some embodiments, a component provided "on" or "over" another component can encompass cases where the former component is directly on (e.g., in physical contact with) the latter component, as well as cases where one or more intervening components are located between the former component and the latter component.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A capacitor comprising:
    a plurality of first electrode layers that are stacked in a first direction;
    a first conductor that extends in the first direction through the plurality of first electrode layers; and
    a first insulating layer that extends in the first direction along the first conductor and is located between the first conductor and the plurality of first electrode layers,
    wherein the capacitor includes first capacitances that are respectively provided between the first conductor and the plurality of first electrode layers,
    wherein a wiring is disposed on top of the plurality of first electrode layers in the first direction.

2. The capacitor according to claim 1, further comprising:
    a second conductor that extends in the first direction through the plurality of first electrode layers; and
    a second insulating layer that extends in the first direction along the second conductor and is located between the second conductor and the plurality of first electrode layers,
    wherein the capacitor includes a second capacitance, connected to the first capacitances, between the second conductor and the plurality of first electrode layers.

3. The capacitor according to claim 2, further comprising:
a plurality of second electrode layers that are stacked in the first direction;
a third conductor that penetrates the plurality of second electrode layers in the first direction;
a third insulating layer that extends in the first direction along the third conductor and is located between the third conductor and the plurality of second electrode layers;
a fourth conductor that penetrates the plurality of second electrode layers in the first direction; and
a fourth insulating layer that extends in the first direction along the fourth conductor and is located between the fourth conductor and the plurality of second electrode layers,
wherein the capacitor includes:
a third capacitance, connected to the second capacitance, between the third conductor and the plurality of second electrode layers; and
a fourth capacitance, connected to the third capacitance, between the fourth conductor and the plurality of second electrode layers.

4. The capacitor according to claim 1, wherein the wiring is electrically connected to each of the plurality of first electrode layers.

5. A storage device comprising a memory region and a capacitor region arranged side by side on an underlayer,
wherein the memory region includes:
a plurality of first electrode layers stacked in a first direction on the underlayer;
a first conductor that extends in the first direction through the plurality of first electrode layers and is electrically connected to the underlayer; and
a first insulating layer that extends in the first direction along the first conductor and is located between the first conductor and the plurality of first electrode layers,
wherein the capacitor region includes:
a plurality of second electrode layers that are stacked in the first direction on the underlayer;
a second conductor that extends in the first direction through the plurality of second electrode layers and is electrically insulated from the underlayer;
a second insulating layer that extends in the first direction along the second conductor and is located between the second conductor and the plurality of second electrode layers;
a third conductor that extends in the first direction through the plurality of second electrode layers and is electrically insulated from the underlayer;
a third insulating layer that extends in the first direction along the third conductor and is located between the third conductor and the plurality of second electrode layers;
a first wiring; and
a second wiring, and
wherein the second conductor is connected to the first wiring and the third conductor is connected to the second wiring that is different from the first wiring.

6. The storage device according to claim 5, wherein one of the plurality of first electrode layers is positioned at substantially the same level as one of the plurality of second electrode layers in the first direction.

7. The storage device according to claim 5, wherein the capacitor region includes first capacitances that are respectively provided between the first conductor and the plurality of first electrode layers.

8. The storage device according to claim 7, wherein the capacitor region further includes a second capacitance, connected to the first capacitances, between the second conductor and the plurality of first electrode layers.

9. The storage device according to claim 8, further comprising:
a third conductor that penetrates the plurality of second electrode layers in the first direction;
a third insulating layer that extends in the first direction along the third conductor and is located between the third conductor and the plurality of second electrode layers;
a fourth conductor that penetrates the plurality of second electrode layers in the first direction; and
a fourth insulating layer that extends in the first direction along the fourth conductor and is located between the fourth conductor and the plurality of second electrode layers,
wherein the capacitor region includes:
a third capacitance, connected to the second capacitance, between the third conductor and the plurality of second electrode layers; and
a fourth capacitance, connected to the third capacitance, between the fourth conductor and the plurality of second electrode layers.

10. The storage device according to claim 5, further comprising a wiring electrically connected to each of the plurality of first electrode layers.

11. The storage device according to claim 5, further comprising:
a third electrode layer stacked on one of the plurality of second electrode layers via the second insulating layer;
a third insulating layer;
a fourth electrode layer stacked on the third electrode layer via the third insulating layer;
a first contact plug electrically connected to each of one of the plurality of first electrode layers and the third electrode layer; and
a second contact plug electrically connected to each of one of the plurality of second electrode layers and the fourth electrode layer.

* * * * *